(12) United States Patent
Priewasser

(10) Patent No.: US 11,784,138 B2
(45) Date of Patent: Oct. 10, 2023

(54) WAFER PROCESSING WITH A PROTECTIVE FILM AND PERIPHERAL ADHESIVE

(71) Applicant: DISCO Corporation, Tokyo (JP)

(72) Inventor: Karl Heinz Priewasser, Munich (DE)

(73) Assignee: DISCO CORPORATION, Tokyo (JP)

( * ) Notice: Subject to any disclaimer, the term of this patent is extended or adjusted under 35 U.S.C. 154(b) by 172 days.

(21) Appl. No.: 17/158,604

(22) Filed: Jan. 26, 2021

(65) Prior Publication Data

US 2021/0151390 A1 May 20, 2021

Related U.S. Application Data

(62) Division of application No. 15/978,869, filed on May 14, 2018, now Pat. No. 11,637,074.

(30) Foreign Application Priority Data

May 18, 2017 (DE) .......................... 102017208405.7

(51) Int. Cl.
*H01L 21/683* (2006.01)
*H01L 21/02* (2006.01)
*H01L 23/00* (2006.01)

(52) U.S. Cl.
CPC ...... *H01L 23/562* (2013.01); *H01L 21/02013* (2013.01); *H01L 21/6836* (2013.01);
(Continued)

(58) Field of Classification Search
CPC ............. H04L 23/562; H04L 21/02013; H04L 21/6836
See application file for complete search history.

(56) References Cited

U.S. PATENT DOCUMENTS 6,777,267 B2 8/2004 Ruby et al.
2004/0147120 A1 7/2004 Rogalli et al.
(Continued)

FOREIGN PATENT DOCUMENTS

DE 102015216619 A1 3/2017
JP 57173135 A 10/1982
(Continued)

OTHER PUBLICATIONS

Priewasser, WO 2017/036512A1, published Mar. 9, 2017.*
German Office Action issued in German Patent App. No. DE 10 2017 208 405.7, dated Feb. 5, 2018.

*Primary Examiner* — Suberr L Chi
(74) *Attorney, Agent, or Firm* — Greer Burns & Crain Ltd.

(57) ABSTRACT

A wafer having on one side a device area with a plurality of devices is processed by providing a protective film and applying the protective film, for covering the devices on the wafer, to the one side of the wafer, so that a front surface of the protective film is in direct contact with the one side of the wafer. The protective film is heated during and/or after applying the protective film to the one side of the wafer, so that the protective film is attached to the one side of the wafer, and the side of the wafer opposite to the one side is processed. Further, the invention relates to a method of processing such a wafer in which a liquid adhesive is dispensed only onto a peripheral portion of a protective film and/or only onto a peripheral portion of the wafer.

6 Claims, 11 Drawing Sheets

(52) U.S. Cl.
CPC ............ *H01L 2221/6834* (2013.01); *H01L 2221/68327* (2013.01)

(56) References Cited

U.S. PATENT DOCUMENTS

| | | |
|---|---|---|
| 2005/0153127 A1 | 7/2005 | Aihara et al. |
| 2008/0200037 A1 | 8/2008 | Tsai et al. |
| 2011/0281504 A1 | 11/2011 | Omomoto |
| 2014/0084423 A1 | 3/2014 | Priewasser |
| 2015/0031215 A1 | 1/2015 | Mahoney et al. |
| 2015/0380291 A1* | 12/2015 | Nakajima ............ H01L 21/304 438/759 |
| 2016/0358898 A1 | 12/2016 | Zhou et al. |
| 2017/0062278 A1 | 3/2017 | Priewasser |
| 2019/0221480 A1 | 7/2019 | Priewasser et al. |
| 2019/0252254 A1 | 8/2019 | Priewasser et al. |

FOREIGN PATENT DOCUMENTS

| | | |
|---|---|---|
| JP | 58153352 A | 9/1983 |
| JP | 2002203821 A | 7/2002 |
| JP | 2003037155 A | 2/2003 |
| JP | 2005191296 A | 7/2005 |
| JP | 2005191297 A | 7/2005 |
| JP | 2005340796 A | 12/2005 |
| JP | 2007165636 A | 6/2007 |
| JP | 2008078430 A | 4/2008 |
| JP | 2009231700 A | 10/2009 |
| JP | 2010027685 A | 2/2010 |
| JP | 2011054827 A | 3/2011 |
| JP | 2013243224 A | 12/2013 |
| KR | 1020120023258 A | 3/2012 |
| KR | 1020170026301 A | 3/2017 |
| WO | 2017036512 A1 | 3/2017 |

\* cited by examiner

WAFER PROCESSING WITH A PROTECTIVE FILM AND PERIPHERAL ADHESIVE

This is a divisional application of application Ser. No. 15/978,869 filed May 14, 2018, which claims the benefit of German Patent Application No. 10 2017 208 405.7, filed on May 18, 2017.

TECHNICAL FIELD

The present invention relates to a method of processing a wafer, such as a semiconductor wafer, having on one side a device area with a plurality of devices.

TECHNICAL BACKGROUND

In a semiconductor device fabrication process, a wafer having a device area with a plurality of devices, commonly partitioned by a plurality of division lines, is divided into individual dies. This fabrication process generally comprises a grinding step for adjusting the wafer thickness and a cutting step of cutting the wafer along the division lines to obtain the individual dies. The grinding step is performed from a back side of the wafer which is opposite to a wafer front side on which the device area is formed. Moreover, also other processing steps, such as polishing and/or etching, may be carried out on the back side of the wafer.

In order to protect the devices formed on the wafer, e.g., from breakage, deformation and/or contamination by debris, grinding water or cutting water, during processing of the wafer, a protective film or sheeting may be applied to the front side of the wafer prior to processing.

Such protection of the devices is particularly important if the device area has an uneven surface structure. For example, in known semiconductor device fabrication processes, such as Wafer Level Chip Scale Package (WLCSP), the device area of the wafer is formed with a plurality of protrusions, such as bumps, protruding from a plane surface of the wafer. These protrusions are used, for example, for establishing an electrical contact with the devices in the individual dies, e.g., when incorporating the dies in electronic equipment, such as mobile phones and personal computers.

In order to achieve a size reduction of such electronic equipment, the semiconductor devices have to be reduced in size. Hence, wafers having the devices formed thereon are ground in the grinding step referred to above to thicknesses in the µm range, e.g., in the range from 20 to 100 µm.

In known semiconductor device fabrication processes, problems may arise during processing, e.g., in the grinding step, if protrusions, such as bumps, are present in the device area. In particular, due to the presence of these protrusions, the risk of breakage of the wafer during processing is significantly increased. Further, if the wafer is ground to a small thickness, e.g., a thickness in the µm range, the protrusions of the device area on the front side of the wafer may cause a deformation of the wafer back side, thus compromising the quality of the resulting dies.

Therefore, the use of a protective film or sheeting is of particular importance when processing wafers with device areas having such uneven surface structures.

However, in particular, for the case of sensitive devices, such as MEMS, there is a problem in that the device structure on the wafer may be damaged by the adhesive force of an adhesive layer formed on the protective film or sheeting or may be contaminated by adhesive residues on the devices, when the film or sheeting is peeled off from the wafer.

Hence, there remains a need for a reliable and efficient method of processing a wafer having a device area which allows for any risk of contamination and damage to the wafer to be minimised.

SUMMARY OF THE INVENTION

Accordingly, it is an object of the present invention to provide a reliable and efficient method of processing a wafer having a device area which allows for any risk of contamination and damage to the wafer to be minimised. This goal is achieved by a wafer processing method with the technical features of claim 1 and by a wafer processing method with the technical features of claim 13. Preferred embodiments of the invention follow from the dependent claims.

The invention provides a method of processing a wafer having on one side a device area with a plurality of devices. The method comprises providing a protective film or sheet and applying the protective film or sheet, for covering the devices on the wafer, to the one side of the wafer, so that a front surface of the protective film or sheet is in direct contact with the one side of the wafer. Further, the method comprises heating the protective film or sheet during and/or after applying the protective film or sheet to the one side of the wafer, so that the protective film or sheet is attached to the one side of the wafer, and processing the side of the wafer being opposite to the one side.

The protective film or sheet is applied to the one side of the wafer, i.e., to the wafer front side, so that the front surface of the protective film or sheet is in direct contact with the one side of the wafer. Thus, no material, in particular, no adhesive, is present between the front surface of the protective film or sheet and the one side of the wafer.

Therefore, any possible contamination of or damage to the devices formed in the device area, e.g., due to an adhesive force of an adhesive layer or adhesive residues on the devices, can be eliminated.

During and/or after applying the protective film or sheet to the one side of the wafer, the protective film or sheet is heated, so that the protective film or sheet is attached to the one side of the wafer. An attachment force between protective film or sheet and wafer, holding the protective film or sheet in its position on the wafer, is thus generated through the heating process. Hence, no additional adhesive material is necessary for attaching the protective film or sheet to the one side of the wafer.

In particular, by heating the protective film or sheet, a form fit, such as a positive fit, and/or a material bond, such as an adhesive bond, may be formed between the protective film or sheet and the wafer. The terms "material bond" and "adhesive bond" define an attachment or connection between protective film or sheet and wafer due to atomic and/or molecular forces acting between these two components.

The term "adhesive bond" relates to the presence of these atomic and/or molecular forces, which act so as to attach or adhere the protective film or sheet to the wafer, and does not imply the presence of an additional adhesive between protective film or sheet and wafer. Rather, the front surface of the protective film or sheet is in direct contact with the one side of the wafer, as has been detailed above.

The method of the present invention thus enables reliable and efficient processing of a wafer having a device area, minimising any risk of contamination and damage to the wafer, in particular, the devices formed in the device area.

The method may further comprise allowing the protective film or sheet to cool down after the heating process. In particular, the protective film or sheet may be allowed to cool down to its initial temperature, i.e., to the temperature thereof prior to the heating process. The protective film or sheet may be allowed to cool down, e.g., to its initial temperature, before processing the side of the wafer being opposite to the one side, i.e., the wafer back side.

As has been detailed above, an attachment force between protective film or sheet and wafer is generated through the heating process. The attachment of the protective film or sheet to the wafer may be caused in the heating process itself and/or in a subsequent process of allowing the protective film or sheet to cool down.

The protective film or sheet may be softened by the heating process, e.g., so as to conform to the wafer surface on the one side of the wafer, for example, absorbing the wafer topography. Upon cooling down, e.g., to its initial temperature, the protective film or sheet may reharden, e.g., so as to create a form fit and/or a material bond to the wafer.

The protective film or sheet may be heat resistant up to a temperature of 180° C. or more, preferably up to a temperature of 220° C. or more, and more preferably up to a temperature of 250° C. or more.

The protective film or sheet may be heated to a temperature in the range of 60° C. to 150° C., preferably 70° C. to 140° C., more preferably 80° C. to 130° C. and even more preferably 90° C. to 120° C. Particularly preferably, the protective film or sheet is heated to a temperature of approximately 100° C.

The protective film or sheet may be heated over a duration in the range of 1 min to 10 min, preferably 1 min to 8 min, more preferably 1 min to 6 min, even more preferably 1 min to 4 min and yet more preferably 1 min to 3 min, during and/or after applying the protective film or sheet to the one side of the wafer.

The protective film or sheet may be directly and/or indirectly heated.

The protective film or sheet may be heated by directly applying heat thereto, e.g., using a heat application means, such as a heated roller, a heated stamp or the like, or a heat radiation means. The protective film or sheet and the wafer may be placed in a receptacle or chamber, such as a vacuum chamber, and an inner volume of the receptacle or chamber may be heated, so as to heat the protective film or sheet. The receptacle or chamber may be provided with a heat radiation means.

The protective film or sheet may be indirectly heated, e.g., by heating the wafer before and/or during and/or after applying the protective film or sheet to the one side of the wafer. For example, the wafer may be heated by placing the wafer on a support or carrier, such as a chuck table, and heating the support or carrier.

For example, the support or carrier, such as a chuck table, may be heated to a temperature in the range of 60° C. to 150° C., preferably 70° C. to 140° C., more preferably 80° C. to 130° C. and even more preferably 90° C. to 120° C. Particularly preferably, the support or carrier may be heated to a temperature of approximately 100° C.

These approaches may also be combined, for example, by using a heat application means, such as a heated roller or the like, or a heat radiation means for directly heating the protective film or sheet, and also indirectly heating the protective film or sheet through the wafer.

It is preferable that the protective film or sheet is pliable, elastic, flexible, stretchable, soft and/or compressible when in its heated state. In this way, it can be particularly reliably ensured that the protective film or sheet conforms to the wafer surface on the one side of the wafer, for example, absorbing the wafer topography. This is especially advantageous if the device area is formed with protrusions protruding from a plane surface of the wafer, as will be further detailed below.

Preferably, the protective film or sheet, at least to some degree, hardens or stiffens upon cooling down, so as to become more rigid and/or robust in the cooled down state. In this way, particularly reliable protection of the devices during subsequent processing of the wafer, such as grinding and/or polishing, can be ensured.

The method may further comprise removing the protective film or sheet from the wafer after processing the back side thereof. Before and/or during removal of the protective film or sheet from the wafer, the protective film or sheet may be heated. In this way, the removal process can be facilitated.

The device area may further have a plurality of division lines, partitioning the plurality of devices.

The wafer may further have, on the front side thereof, a peripheral marginal area having no devices and being formed around the device area.

The wafer may be, for example, a semiconductor wafer, a glass wafer, a sapphire wafer, a ceramic wafer, such as an alumina ($Al_2O_3$) ceramic wafer, a quartz wafer, a zirconia wafer, a PZT (lead zirconate titanate) wafer, a polycarbonate wafer, a metal (e.g., copper, iron, stainless steel, aluminium or the like) or metalised material wafer, a ferrite wafer, an optical crystal material wafer, a resin, e.g., epoxy resin, coated or molded wafer or the like.

In particular, the wafer may be, for example, a Si wafer, a GaAs wafer, a GaN wafer, a GaP wafer, an InAs wafer, an InP wafer, a SiC wafer, a SiN wafer, a LT (lithium tantalate) wafer, a LN (lithium niobate) wafer or the like.

The wafer may be made of a single material or of a combination of different materials, e.g., two or more of the above-identified materials. For example, the wafer may be a Si and glass bonded wafer, in which a wafer element made of Si is bonded to a wafer element made of glass.

The wafer may have any type of shape. In a top view thereon, the wafer may have, for example, a circular shape, an oval shape, an elliptical shape or a polygonal shape, such as a rectangular shape or a square shape.

The protective film or sheet may have any type of shape. In a top view thereon, the protective film or sheet may have, for example, a circular shape, an oval shape, an elliptical shape or a polygonal shape, such as a rectangular shape or a square shape.

The protective film or sheet may have substantially the same shape or the same shape as the wafer.

The protective film or sheet may have substantially the same shape or the same shape as the device area of the wafer. For example, the protective film or sheet may have an outer diameter which is substantially the same as an outer diameter of the device area, and the protective film or sheet may have substantially the same shape or the same shape as the device area of the wafer.

The device area may be formed with a plurality of protrusions or projections protruding from a plane surface of the wafer. The protrusions or projections protruding from the plane surface of the wafer may be embedded in the protective film or sheet.

The protrusions or projections, such as bumps, may protrude, extend or project from a plane surface of the wafer which is a substantially flat surface. The protrusions or projections may define a surface structure or topography of the one side of the wafer, i.e., the front side thereof, rendering this one side uneven.

These protrusions or projections may be used, for example, for establishing an electrical contact with the devices in individual chips or dies after the wafer has been divided, e.g., when incorporating the chips or dies in electronic equipment, such as mobile phones and personal computers.

The protrusions may be irregularly arranged or arranged in a regular pattern. Only some of the protrusions may be arranged in a regular pattern.

The protrusions may have any type of shape. For example, some or all of the protrusions may be in the shape of spheres, semi-spheres, pillars or columns, e.g., pillars or columns with a circular, elliptic or polygonal, such as triangular, square etc., cross-section or base area, cones, truncated cones or steps.

At least some of the protrusions may arise from elements formed on the plane surface of the wafer. At least some of the protrusions may arise from elements partly or entirely penetrating the wafer in its thickness direction, e.g., for the case of a through silicon via (TSV). These latter elements may extend along part of the wafer thickness or along the entire wafer thickness.

The protrusions may have a height in the thickness direction of the wafer in the range of 20 to 500 μm, preferably 30 to 400 μm, more preferably 40 to 250 μm, even more preferably 50 to 200 μm and yet even more preferably 70 to 150 μm.

All the protrusions may have substantially the same shape and/or size. Alternatively, at least some of the protrusions may differ from each other in shape and/or size.

In the wafer processing method of the present invention, the protrusions or projections protruding from the plane surface of the wafer may be embedded in the protective film or sheet. Hence, any negative influence of the surface unevenness arising from the presence of the protrusions in the device area on subsequent wafer processing steps can be reduced or even eliminated.

In particular, by embedding the protrusions in the protective film or sheet, the protrusions can be protected from any damage during wafer processing, for example, in subsequent grinding and/or cutting steps.

Further, if the wafer is ground to a small thickness, e.g., a thickness in the μm range, the protrusions of the device area on the front side of the wafer may cause a deformation of the wafer back side, due to the reduced thickness of the wafer and the pressure applied thereto in the grinding process. This latter effect is referred to as "pattern transfer", since the pattern of the protrusions on the wafer front side is transferred to the wafer back side, and results in an undesired unevenness of the back side surface of the wafer, thus compromising the quality of the resulting chips or dies.

The protective film or sheet acts as a cushion or buffer between the wafer front side and, for example, a support or carrier on which the wafer front side rests during processing, e.g., grinding and/or polishing, the wafer back side, thus contributing to achieving a uniform and homogenous distribution of pressure during processing. Hence, a pattern transfer or breakage of the wafer during processing the back side thereof can be prevented.

The method may further comprise, during and/or after applying the protective film or sheet to the one side of the wafer, applying pressure to a back surface of the protective film or sheet opposite to the front surface thereof. In this way, the front surface of the protective film or sheet is pressed against the one side of the wafer. Thus, it can be particularly efficiently ensured that the protective film or sheet is reliably attached to the wafer.

The pressure may be applied to the back surface of the protective film or sheet before and/or during and/or after heating the protective film or sheet. The pressure may be applied to the back surface of the protective film or sheet before processing the back side of the wafer.

The pressure may be applied to the back surface of the protective film or sheet by a pressure application means, such as a roller, a stamp, a membrane or the like.

Particularly preferably, a combined heat and pressure application means, such as a heated roller or a heated stamp, may be used. In this case, pressure can be applied to the back surface of the protective film or sheet while, at the same time, heating the protective film or sheet.

The pressure may be applied to the back surface of the protective film or sheet in a vacuum chamber, as will be further detailed below.

The protective film or sheet may be applied and/or attached to the front side of the wafer in a reduced pressure atmosphere, in particular, under a vacuum. In this way, it can be reliably ensured that no voids and/or air bubbles are present between the protective film or sheet and the wafer. Hence, any stress or strain on the wafer during processing the back side thereof, e.g., due to such air bubbles expanding in the heating process, is avoided.

For example, the step or steps of applying and/or attaching the protective film or sheet to the one side of the wafer may be carried out in a vacuum chamber. In particular, the protective film or sheet may be applied and/or attached to the one side of the wafer by using a vacuum laminator. In such a vacuum laminator, the wafer is placed on a chuck table in a vacuum chamber in a state in which the wafer back side is in contact with an upper surface of the chuck table and the wafer front side is oriented upward. The chuck table may be, for example, a heated chuck table.

The protective film or sheet to be applied to the wafer front side is held at its peripheral portion by an annular frame and placed above the wafer front side in the vacuum chamber. An upper part of the vacuum chamber which is situated above the chuck table and the annular frame is provided with an air inlet port closed by an expandable rubber membrane.

After the wafer and the protective film have been loaded into the vacuum chamber, the chamber is evacuated and air is supplied through the air inlet port to the rubber membrane, causing the rubber membrane to expand into the evacuated chamber. In this way, the rubber membrane is moved downward in the vacuum chamber so as to push the protective film or sheet against the wafer front side, sealing the peripheral wafer portion with the protective film or sheet and pressing the film or sheet against the device area on the wafer front side. Hence, the protective film can be applied closely to the wafer front side, so as to follow the contours of the device area, e.g., the contours of protrusions or projections present therein.

The protective film or sheet may be heated during and/or after application thereof to the one side of the wafer, e.g., by heating the chuck table.

Subsequently, the vacuum in the vacuum chamber is released and the protective film or sheet is held in its position on the wafer front side by the attachment force generated through the heating process and the positive pressure in the vacuum chamber.

Alternatively, the rubber membrane can be replaced by a soft stamp or a soft roller, e.g., a heated soft stamp or a heated soft roller.

Processing the side of the wafer being opposite to the one side, i.e., the wafer back side, may comprise or consist of grinding and/or polishing and/or etching the side of the wafer being opposite to the one side.

In particular, processing the side of the wafer being opposite to the one side may comprise or consist of grinding the side of the wafer being opposite to the one side for adjusting the wafer thickness. In this case, the method of the invention can be employed in a particularly advantageous manner.

Specifically, in the grinding process, considerable pressure is applied to the back side of the wafer. This pressure may cause damage to the wafer, such as breakage and/or deformation thereof, in particular, if the wafer is ground to a small thickness, e.g., a thickness in the μm range. For example, a pattern of protrusions or projections formed on the wafer front side may be transferred to the wafer back side, as has been detailed above.

In the method of the present invention, the protective film or sheet acts as a cushion or buffer between the wafer front side and, for example, a support or carrier, such as a chuck table, on which the wafer front side rests during grinding the wafer back side. Hence, a more uniform and homogenous distribution of pressure during grinding can be achieved, reducing or even eliminating the risk of a pattern transfer or breakage of the wafer during grinding.

The method may further comprise cutting the wafer, e.g., along division lines partitioning the plurality of devices.

The wafer may be cut from the front side or the back side thereof. The cutting of the wafer may form part of or constitute the processing of the side of the wafer being opposite to the one side.

The cutting may be performed by mechanical cutting, e.g., by blade dicing or sawing, and/or by laser cutting and/or by plasma cutting. The wafer may be cut in a single mechanical cutting step, a single laser cutting step or a single plasma cutting step. Alternatively, the wafer may be cut by a sequence of mechanical cutting and/or laser cutting and/or plasma cutting steps.

Laser cutting may be performed, for example, by ablation laser cutting and/or by stealth laser cutting, i.e., by forming modified areas within the wafer by the application of a laser beam, and/or by forming a plurality of hole regions in the wafer by the application of a laser beam. Each of these hole regions may be composed of a modified region and a space in the modified region open to a surface of the wafer.

The cutting of the wafer may be performed in a state in which the protective film or sheet is attached to the wafer. In this way, it can be ensured that the pressure applied during the cutting step is more uniformly and homogenously distributed throughout the wafer during cutting, thus reducing or even minimising any risk of damage to the wafer, e.g., cracking of the sidewalls of the resulting chips or dies, in the cutting step. In this case, it is particularly preferred that the wafer be cut from the back side thereof.

The protective film or sheet may have an outer diameter which is larger than an outer diameter of the wafer. In this way, processing, handling and/or transport of the wafer can be facilitated. In particular, an outer peripheral portion of the protective film or sheet can be attached to an annular frame, as will be detailed below.

The protective film or sheet may have an outer diameter which is smaller than the outer diameter of the wafer.

The protective film or sheet may have an outer diameter which is substantially the same as the outer diameter of the wafer.

The protective film or sheet may have an outer diameter which is substantially the same as an outer diameter of the device area. In this way, a particularly efficient use of resources is ensured, while reliably protecting the devices formed in the device area.

The method may further comprise cutting the protective film or sheet. The protective film or sheet may be cut so that it has an outer diameter which is larger than the outer diameter of the wafer or smaller than the outer diameter of the wafer or substantially the same as the outer diameter of the wafer or substantially the same as the outer diameter of the device area.

The step of cutting the protective film or sheet may be performed before or after applying the protective film or sheet to the wafer.

The step of cutting the protective film or sheet may be performed before or after attaching the protective film or sheet to the wafer.

The method may further comprise attaching an outer peripheral portion of the protective film or sheet to an annular frame. In particular, the outer peripheral portion of the protective film or sheet may be attached to the annular frame so that the protective film or sheet closes a central opening of the annular frame, i.e., the area inside the inner diameter of the annular frame. In this way, the wafer, which is attached to the protective film or sheet, in particular, to a central portion thereof, is held by the annular frame through the protective film or sheet. Thus, a wafer unit, comprising the wafer, the protective film or sheet and the annular frame, is formed, facilitating processing, handling and/or transport of the wafer.

The step of attaching the outer peripheral portion of the protective film or sheet to the annular frame may be performed before or after applying the protective film or sheet to the wafer.

The step of attaching the outer peripheral portion of the protective film or sheet to the annular frame may be performed before or after attaching the protective film or sheet to the wafer.

The step of attaching the outer peripheral portion of the protective film or sheet to the annular frame may be performed before or after processing the back side of the wafer.

The annular frame may be a semiconductor-sized annular frame. Herein, the term "semiconductor-sized annular frame" refers to an annular frame with the dimensions (standardised dimensions), in particular, the inner diameter (standardised inner diameter), of an annular frame for holding a semiconductor wafer.

The dimensions, in particular, the inner diameters, of annular frames for holding semiconductor wafers are defined in the SEMI standards. For example, the dimensions of tape frames for 300 mm wafers are defined in SEMI standard SEMI G74 and the dimensions of plastic tape frames for 300 mm wafers are defined in SEMI standard SEMI G87. The annular frames may have frame sizes for holding semiconductor-sized wafers with sizes of, for example, 3 inch, 4 inch, 5 inch, 6 inch, 8 inch, 12 inch or 18 inch.

The outer peripheral portion of the protective film or sheet may be attached to the annular frame through a substantially annular or annular adhesive layer. Herein, the term "substantially annular" defines that the shape of the adhesive layer may deviate from a perfect annulus, e.g., due to the presence of one or more flat or straight portions, notches and/or grooves. The substantially annular or annular adhesive layer may be arranged between the protective film or sheet and the annular frame.

The substantially annular or annular adhesive layer may be applied to an outer peripheral portion of the front surface of the protective film or sheet. The adhesive layer may be provided only in the outer peripheral portion of the front surface of the protective film or sheet.

The substantially annular or annular adhesive layer may be applied to a surface of the annular frame which is to be attached to the outer peripheral portion of the protective film or sheet.

The substantially annular or annular adhesive layer may be a continuous adhesive layer. Alternatively, the substantially annular or annular adhesive layer may be a discontinuous adhesive layer. In particular, in the substantially annular or annular adhesive layer, the adhesive may be provided in a discontinuous form, such as a dotted form, a stripe form, e.g., with straight and/or curved stripes, or the like.

The substantially annular or annular adhesive layer may be heat resistant up to a temperature of 180° C. or more, preferably up to a temperature of 220° C. or more, and more preferably up to a temperature of 250° C. or more.

An inner diameter of the substantially annular or annular adhesive layer may be substantially equal to or larger than an inner diameter of a semiconductor-sized annular frame for holding a semiconductor-sized wafer.

Herein, the term "semiconductor-sized wafer" refers to a wafer with the dimensions (standardised dimensions), in particular, the diameter (standardised diameter), i.e., outer diameter, of a semiconductor wafer. The dimensions, in particular, the diameters, i.e., outer diameters, of semiconductor wafers are defined in the SEMI standards. For example, the semiconductor-sized wafer may be a Si wafer. The dimensions of polished single crystal Si wafers are defined in the SEMI standards M1 and M76. The semiconductor-sized wafer may be a 3 inch, 4 inch, 5 inch, 6 inch, 8 inch, 12 inch or 18 inch wafer.

The inner diameter of the substantially annular or annular adhesive layer is larger than the outer diameter of the wafer.

An outer diameter of the substantially annular or annular adhesive layer may be larger than the inner diameter of a semiconductor-sized annular frame for holding a semiconductor-sized wafer.

The method may further comprise attaching a cushioning layer to a back surface of the protective film or sheet opposite to the front surface thereof.

The device area may be formed with a plurality of protrusions or projections, such as bumps, protruding from a plane surface of the wafer, as has been detailed above. The protrusions or projections protruding from the plane surface of the wafer may be embedded in the cushioning layer.

By embedding the protrusions or projections in the cushioning layer, the protrusions or projections are particularly reliably protected from any damage during wafer processing, for example, in subsequent grinding and/or cutting steps.

The protective film or sheet covers the devices formed in the device area of the wafer, therefore protecting the devices from damage and contamination. Moreover, the protective film or sheet facilitates removal of the cushioning layer from the wafer after processing. In particular, since the front surface of the protective film or sheet is in direct contact with the front side of the wafer, i.e., no adhesive is present between the front surface of the protective film or sheet and the wafer front side, the protective film or sheet and the cushioning layer can be removed from the wafer in an especially simple and efficient manner.

The cushioning layer may be formed of any type of material which allows for the protrusions or projections protruding from the plane surface of the wafer to be embedded therein. For example, the cushioning layer may be formed of a resin, an adhesive, a gel or the like.

The cushioning layer may be heat resistant up to a temperature of 180° C. or more, preferably up to a temperature of 220° C. or more, and more preferably up to a temperature of 250° C. or more.

The cushioning layer may have a thickness in the range of 20 to 300 μm, preferably 50 to 250 μm and more preferably 80 to 200 μm.

Attaching the cushioning layer to the back surface of the protective film or sheet is particularly advantageous for wafers having a relatively high degree of surface roughness or unevenness on the front side thereof, e.g., due to the presence of protrusions or projections, such as bumps. In this case, the protrusions or projections may not be fully embedded in the protective film or sheet, so that at least a certain degree of surface unevenness is present on the back surface of the protective film or sheet. This surface unevenness can be absorbed by the cushioning layer, further embedding the protrusions or projections. Thus, the protrusions or projections can be protected in a particularly reliable manner. Moreover, the distribution of stress or strain over the wafer during processing thereof can be further improved, as will be detailed below.

A front surface of the cushioning layer may be in contact with the back surface of the protective film or sheet. A back surface of the cushioning layer opposite to the front surface thereof may be substantially parallel to the side of the wafer being opposite to the one side.

In this case, when processing, e.g., grinding, polishing and/or cutting, the back side of the wafer, a suitable counter pressure can be applied to the back surface of the cushioning layer, e.g., by placing this back surface on a support or carrier, such as a chuck table.

Since the plane back surface of the cushioning layer is substantially parallel to the back side of the wafer, the pressure applied to the wafer during processing, such as grinding, e.g., by a grinding wheel of a grinding apparatus, is evenly and homogenously distributed over the wafer, thus minimising any risk of a pattern transfer, i.e., a transfer of a pattern defined by protrusions or projections in the device area to the processed, e.g., ground wafer back side, and breakage of the wafer. Further, the substantially parallel alignment of the flat, even back surface of the cushioning layer and the back side of the wafer allows for the processing step to be carried out with a high degree of precision thus, for example, achieving a particularly uniform and homogenous wafer thickness after grinding.

Also, the protective film or sheet acts as a further cushion or buffer between the wafer front side and the cushioning layer, thus further contributing to the uniform and homogeneous distribution of pressure during processing, such as grinding. Hence, a pattern transfer or breakage of the wafer during processing can be particularly reliably prevented.

The back surface of the cushioning layer may be made substantially parallel to the back side of the wafer by applying pressure to the back surface of the cushioning layer. The pressure may be applied directly to the back surface of the cushioning layer, i.e., so that no additional element or component is present between a pressing means for applying the pressure and the back surface of the cushioning layer.

For example, the wafer and the cushioning layer may be pressed together, with the protective film or sheet arranged inbetween, by applying a parallel pressing force to the wafer back side and the back surface of the cushioning layer, for example, in a mounting chamber, such as a vacuum chamber. The pressure may be applied, e.g., by means of two parallel pressing plates. The pressing plates may be heated pressing plates, allowing for the protective film or sheet to be heated during the pressing process.

The cushioning layer may be curable by an external stimulus, such as UV radiation, heat, an electric field and/or a chemical agent. In this case, the cushioning layer hardens at least to some degree upon application of the external stimulus thereto. For example, the cushioning layer may be formed of a curable resin, a curable adhesive, a curable gel or the like.

The cushioning layer may be configured so as to exhibit a degree of compressibility, elasticity and/or flexibility after curing thereof, i.e., to be compressible, elastic and/or flexible after curing. For example, the cushioning layer may be such that it is brought into a rubber-like state by curing. Alternatively, the cushioning layer may be configured so as to reach a rigid, hard state after curing.

Preferred examples of UV curable resins for use as the cushioning layer in the processing method of the invention are ResiFlat by the DISCO Corporation and TEMPLOC by DENKA.

The method of the invention may further comprise applying the external stimulus to the cushioning layer so as to cure the cushioning layer, after applying the protective film or sheet to the one side of the wafer. The external stimulus may be applied to the cushioning layer after attaching the protective film or sheet to the one side of the wafer.

The external stimulus may be applied to the cushioning layer before processing, e.g., grinding, the wafer back side. In this way, the protection of the wafer during processing and the processing accuracy can be further improved.

The protective film or sheet facilitates removal of the curable or cured cushioning layer attached thereto from the wafer. In particular, due to the presence of the protective film or sheet, the cushioning layer can be removed from the wafer in a reliable and simple manner, avoiding any residues, such as resin, adhesive or gel residues, in the device area, thus preventing contamination of the devices, and minimising the risk of damaging the protrusions or projections in the removal process.

The cured cushioning layer can be removed after curing in a particularly reliable and efficient manner if the curable cushioning layer exhibits a degree of compressibility, elasticity and/or flexibility, i.e., is compressible, elastic and/or flexible, for example, rubber-like, after curing.

If the cushioning layer is configured so as to reach a rigid, hard state upon curing, removal of the cushioning layer from the wafer may be facilitated by applying an external stimulus to the cured cushioning layer, softening or removing the cushioning layer at least to some extent. For example, some cushioning layers, e.g., formed of the UV curable resin TEMPLOC by DENKA, may be treated by applying hot water thereto after curing, in order to soften the cured cushioning layer and allow for a particularly easy removal of the cushioning layer from the wafer.

The cushioning layer may be attached to the back surface of the protective film or sheet before applying the protective film or sheet to the one side of the wafer.

In this case, the protective film or sheet and the cushioning layer may be laminated first, forming a protective sheeting comprising the cushioning layer and the protective film or sheet attached to the cushioning layer. The protective sheeting formed in this manner may be subsequently applied to the one side of the wafer, e.g., such that protrusions or projections protruding from the plane surface of the wafer are covered by the protective film or sheet and embedded in the protective film or sheet and the cushioning layer, and the back surface of the cushioning layer is substantially parallel to the side of the wafer being opposite to the one side, i.e., the wafer back side. The front surface of the protective film or sheet is applied to the one side of the wafer when the protective sheeting is applied to the one side of the wafer.

In this way, the wafer processing method can be carried out in a particularly simple and efficient manner. For example, the protective sheeting can be prepared in advance, stored for later use and used for wafer processing when required. The protective sheeting may thus be manufactured in large quantities, rendering the production thereof particularly efficient in terms of both time and cost.

The cushioning layer may be attached to the back surface of the protective film or sheet after applying the protective film or sheet to the one side of the wafer.

In this case, the protective film or sheet is applied to the one side of the wafer first, and the one side of the wafer, having the protective film applied thereto, is subsequently attached to the front surface of the cushioning layer, e.g., so that protrusions or projections protruding from the plane surface of the wafer are embedded in the protective film or sheet and the cushioning layer, and the back surface of the cushioning layer is substantially parallel to the side of the wafer being opposite to the one side. This approach allows for the protective film or sheet to be attached to the one side of the wafer with a particularly high degree of accuracy, in particular, in relation to protrusions or projections protruding from the plane surface of the wafer.

The cushioning layer may be attached to the back surface of the protective film or sheet before and/or during and/or after attaching the protective film or sheet to the one side of the wafer.

The method of the invention may further comprise removing the protective film or sheet and the cushioning layer from the wafer. The protective film or sheet and the cushioning layer may be removed from the wafer after processing, such as grinding. For example, the protective film or sheet and the cushioning layer may be removed from the wafer after grinding but before cutting or after grinding and cutting. In this way, individual chips or dies obtained in the cutting process can be separated and picked up in a simple and reliable manner. For instance, if the protective film and the cushioning layer are provided in the form of the protective sheeting detailed above, the protective sheeting may be removed from the wafer after grinding or after grinding and cutting.

The cushioning layer and the protective film or sheet may be removed individually, i.e., one after the other. For example, the cushioning layer may be removed first, followed by the removal of the protective film or sheet.

Cutting of the wafer may be performed before removing the protective film or sheet and the cushioning layer from the wafer. In this case, the wafer is safely protected by the protective film and the cushioning layer in the cutting process. Hence, any damage to the wafer during cutting can be particularly reliably avoided.

Alternatively, cutting of the wafer may be performed after removing the protective film or sheet and the cushioning layer from the wafer. This approach allows for the individual chips or dies to be separated and picked up immediately after the cutting step. In this case, it is particularly preferable to perform the cutting step from the front side of the wafer.

The method may further comprise attaching a base sheet to a back surface of the cushioning layer, so that a front surface of the base sheet is in direct contact with the back surface of the cushioning layer.

The material of the base sheet is not particularly limited.

The base sheet may be made of a soft or pliable material, such as, for example, a polymer material, e.g., polyvinyl chloride (PVC) or ethylene vinyl acetate (EVA).

Alternatively, the base sheet may be made of a rigid or hard material, such as polyethylene terephthalate (PET) and/or silicon and/or glass and/or stainless steel (SUS).

For example, if the base sheet is made of polyethylene terephthalate (PET) or glass and the cushioning layer is curable by an external stimulus, the cushioning layer may be cured with radiation that is transmittable through polyethylene terephthalate (PET) or glass, for instance UV radiation. If the base sheet is made of silicon or stainless steel (SUS), a cost-efficient base sheet is provided.

Also, the base sheet may be formed of a combination of the materials listed above.

The base sheet may be heat resistant up to a temperature of 180° C. or more, preferably up to a temperature of 220° C. or more, and more preferably up to a temperature of 250° C. or more.

The base sheet may have a thickness in the range of 30 to 1500 µm, preferably 40 to 1200 µm and more preferably 50 to 1000 µm. Particularly preferably, the base sheet has a thickness in the range of 30 to 250 µm. A thickness of the base sheet of 50 µm is especially preferred. For example, the base sheet may be a polyethylene terephthalate (PET) film with a thickness of 50 µm.

The cushioning layer and the base sheet may be attached to the back surface of the protective film or sheet before or after applying the protective film or sheet to the front side of the wafer. In particular, the protective film or sheet, the cushioning layer and the base sheet may be laminated first, forming a protective sheeting comprising the base sheet, the cushioning layer and the protective film or sheet attached to the cushioning layer. The protective sheeting formed in this manner may be subsequently applied to the front side of the wafer, so that the front surface of the protective film or sheet is in direct contact with the wafer front side.

The protective film or sheet may be made of a plastic material, such as a polymer. Particularly preferably, the protective film or sheet is made of a polyolefin. For example, the protective film or sheet may be made of polyethylene (PE) or polypropylene (PP).

Polyolefin films have material properties which are particularly advantageous for use in the wafer processing method of the present invention. In particular, such films are pliable, stretchable and soft when in a heated state, e.g., when heated to a temperature in the range of 60° C. to 150° C. Thus, it can be particularly reliably ensured that the protective film or sheet conforms to the wafer surface on the one side of the wafer, for example, absorbing the wafer topography. This is particularly beneficial if the device area is formed with protrusions or projections protruding from a plane surface of the wafer.

Further, polyolefin films harden and stiffen upon cooling down, so as to become more rigid and robust in the cooled down state. Hence, particularly reliable protection of the devices during subsequent processing of the wafer, such as grinding and/or polishing, can be ensured.

The protective film or sheet may have a thickness in the range of 5 to 200 µm, preferably 8 to 100 µm, more preferably 10 to 80 µm and even more preferably 12 to 50 µm. Particularly preferably, the protective film or sheet has a thickness in the range of 80 to 150 µm. In this way, it can be ensured that the protective film or sheet is flexible and pliable enough to sufficiently conform to the contours of the device area and, at the same time, exhibits a sufficient thickness in order to reliably and efficiently protect the devices formed in the device area.

The invention further provides a method of processing a wafer, having on one side a device area with a plurality of devices, wherein the method comprises providing a protective film or sheet, providing a liquid adhesive, and dispensing the liquid adhesive onto the protective film or sheet and/or onto the wafer. Further, the method comprises applying the protective film or sheet, for covering the devices on the wafer, to the one side of the wafer, i.e., the wafer front side, and processing the side of the wafer being opposite to the one side, i.e., the wafer back side. The liquid adhesive is dispensed only onto a peripheral portion of the protective film or sheet and/or only onto a peripheral portion of the wafer.

The wafer may have the properties, characteristics and features described in detail above.

The protective film or sheet may have the properties, characteristics and features described in detail above. In particular, the protective film or sheet may be used in combination with a cushioning layer or a cushioning layer and a base sheet as described in detail above.

A cushioning layer may be attached to a back surface of the protective film, substantially in the same manner as detailed above.

A base sheet may be attached to a back surface of the cushioning layer, substantially in the same manner as detailed above.

The step of processing the side of the wafer being opposite to the one side may be performed in the manner described in detail above.

According to the method, the liquid adhesive is dispensed only onto the peripheral portion of the protective film or sheet and/or only onto the peripheral portion of the wafer.

Hence, an adhesive force between protective film or sheet and wafer, generated by the adhesive, is considerably reduced, e.g., as compared to the case where an adhesive is applied to the entire front side of the wafer. Therefore, any damage to the devices formed in the device area, e.g., due to an adhesive force of the adhesive, can be significantly reduced or even entirely prevented.

Further, in this way, a possible contamination of the devices formed in the device area, e.g., due to adhesive residues on the devices, can be considerably reduced or even fully avoided.

Dispensing the adhesive in liquid form onto the peripheral portion of the protective film or sheet and/or onto the peripheral portion of the wafer allows for the adhesive to be applied in an accurate and efficient manner. In particular, the adhesive can be precisely dosed so as to reliably avoid contamination of the devices formed in the device area.

The method thus enables reliable and efficient processing of a wafer having a device area, minimising any risk of contamination and damage to the wafer, in particular, the devices formed in the device area.

The wafer may have any type of shape. In a top view thereof, the wafer may have, for example, a circular shape, an oval shape, an elliptical shape or a polygonal shape, such as a rectangular shape or a square shape.

The protective film or sheet may have any type of shape. In a top view thereof, the protective film or sheet may have, for example, a circular shape, an oval shape, an elliptical shape or a polygonal shape, such as a rectangular shape or a square shape.

The protective film or sheet may have substantially the same shape or the same shape as the wafer. The protective film or sheet may have substantially the same shape or the same shape as the device area of the wafer.

The liquid adhesive may be dispensed only onto the peripheral portion of the protective film or sheet and/or only onto the peripheral portion of the wafer so as to form an adhesive layer which has a substantially annular or annular shape.

The liquid adhesive may be dispensed so as to form a continuous adhesive layer. Alternatively, the liquid adhesive may be dispensed so as to form a discontinuous adhesive layer. In particular, in the adhesive layer formed by the liquid adhesive, the adhesive may be provided in a discontinuous form, such as a dotted form, a stripe form, e.g., with straight and/or curved stripes, or the like.

The adhesive may be heat resistant up to a temperature of 180° C. or more, preferably up to a temperature of 220° C. or more, and more preferably up to a temperature of 250° C. or more.

The liquid adhesive may be, for example, a liquid adhesive produced by Brewer Science, such as the BrewerBOND® 220 Material (see http://www.brewerscience.com/product-categories/wafer-level-packaging/).

The liquid adhesive may be dispensed by means of a dispenser. The dispenser may be, e.g., a mechanical dispenser or an air pulse dispenser.

The dispenser may be, for example, a dispenser produced by Musashi Engineering, such as the dispenser ML-5000XII (see http://www.musashi-engineering.co.jp.e.cn.hp.transer.com/products/).

The protective film or sheet may be attached to the one side of the wafer through the adhesive dispensed onto the peripheral portion of the protective film or sheet and/or onto the peripheral portion of the wafer.

In particular, the liquid adhesive may be dispensed onto the peripheral portion of the protective film or sheet and/or onto the peripheral portion of the wafer, and the protective film or sheet may be applied to the one side of the wafer so that the peripheral portion of the protective film or sheet is attached to the peripheral portion of the wafer through the adhesive.

In some embodiments, the liquid adhesive is dispensed only onto the peripheral portion of the protective film or sheet but not onto the wafer. In other embodiments, the liquid adhesive is dispensed only onto the peripheral portion of the wafer but not onto the protective film or sheet. Further, the liquid adhesive may be dispensed onto the peripheral portion of the protective film or sheet and onto the peripheral portion of the wafer.

The protective film or sheet may be attached to the one side of the wafer before dispensing the liquid adhesive.

In particular, the protective film or sheet may be attached to the one side of the wafer by heating the protective film or sheet during and/or after applying the protective film or sheet to the one side of the wafer in the manner detailed above. The protective film or sheet may be attached to the one side of the wafer by using the approach explained in detail above.

Subsequently, after the protective film or sheet has been attached to the one side of the wafer, the liquid adhesive may be dispensed. The liquid adhesive may be dispensed so as to seal or cover any gaps which may be present between protective film or sheet and wafer at the peripheral portions thereof. By dispensing the adhesive in liquid form, it can be particularly reliably ensured that such gaps are efficiently sealed or covered.

The liquid adhesive may be dispensed onto the protective film or sheet and/or onto the wafer before applying the protective film or sheet to the one side of the wafer and/or after applying the protective film or sheet to the one side of the wafer. The liquid adhesive may be dispensed onto the protective film or sheet and/or onto the wafer after applying the protective film or sheet to the one side of the wafer but before attaching the protective film or sheet to the one side of the wafer.

The liquid adhesive may be dispensed onto the protective film or sheet and/or onto the wafer after applying the protective film or sheet to the one side of the wafer and the protective film or sheet may be attached to the one side of the wafer by the adhesive thus dispensed. Also in this case, dispensing the adhesive in liquid form allows for a particularly accurate and efficient application of the adhesive.

The liquid adhesive may be dispensed onto the protective film or sheet and/or onto the wafer so that, after applying the protective film or sheet to the one side of the wafer, no adhesive is present in the device area of the wafer. In particular, the adhesive may only be present in a peripheral marginal area on the front side of the wafer, the peripheral marginal area having no devices and being formed around the device area. After applying the protective film or sheet to the one side of the wafer, the region of the protective film or sheet in which no adhesive is present may have substantially the same shape and/or size as the device area of the wafer.

The liquid adhesive may be dispensed onto a peripheral portion of a front surface of the protective film or sheet, i.e., a surface of the protective film or sheet which is to be applied to the wafer, and/or onto a peripheral side edge of the protective film or sheet.

The liquid adhesive may be dispensed onto a peripheral portion of the front side of the wafer and/or onto a peripheral side edge of the wafer.

The protective film or sheet may have an outer diameter which is larger than an outer diameter of the wafer.

The protective film or sheet may have an outer diameter which is smaller than the outer diameter of the wafer.

The protective film or sheet may have an outer diameter which is substantially the same as the outer diameter of the wafer.

The protective film or sheet may have an outer diameter which is substantially the same as an outer diameter of the device area.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to methods for processing a wafer W.

Figure 1:
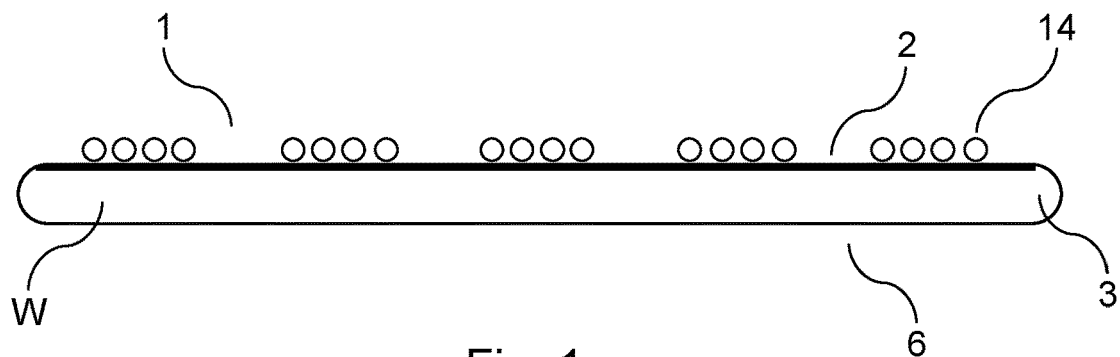
FIG. 1 is a cross-sectional view showing a wafer to be processed by the method of the present invention.

The wafer W can be, for example, a MEMS wafer having MEMS devices formed on the surface of a front side 1 thereof (see FIG. 1). However, the wafer W is not limited to a MEMS wafer, but may also be a CMOS wafer having CMOS devices, preferably as solid-state imaging devices, formed on the front side 1 thereof or a wafer with other types of devices on the front side 1.

The wafer W may be made of a semiconductor, e.g., silicon. Such a silicon wafer W can include devices, such as ICs (integrated circuits) and LSIs (large scale integrations), on a silicon substrate. Alternatively, the wafer may be an optical device wafer configured by forming optical devices, such as LEDs (light emitting diodes), on an inorganic material substrate of, for example, ceramic, glass or sapphire. The wafer W is not limited to this and can be formed in any other way. Furthermore, also a combination of the above described exemplary wafer designs is possible.

The wafer W can have a thickness before grinding in the μm range, preferably in the range of 625 to 925 μm.

The wafer W preferably exhibits a circular shape. However, the shape of the wafer W is not particularly limited. In other embodiments, the wafer W may have, for example, an oval shape, an elliptical shape or a polygonal shape, such as a rectangular shape or a square shape.

The wafer W is provided with a plurality of crossing division lines 11 (see FIG. 3), called streets, formed on the front side 1 thereof, thereby partitioning the wafer W into a plurality of rectangular regions where devices 7, such as those described previously, are respectively formed. These devices 7 are formed in a device area 2 of the wafer W. In the case of a circular wafer W, this device area 2 is preferably circular and arranged concentrically with the outer circumference of the wafer W.

Figure 2:
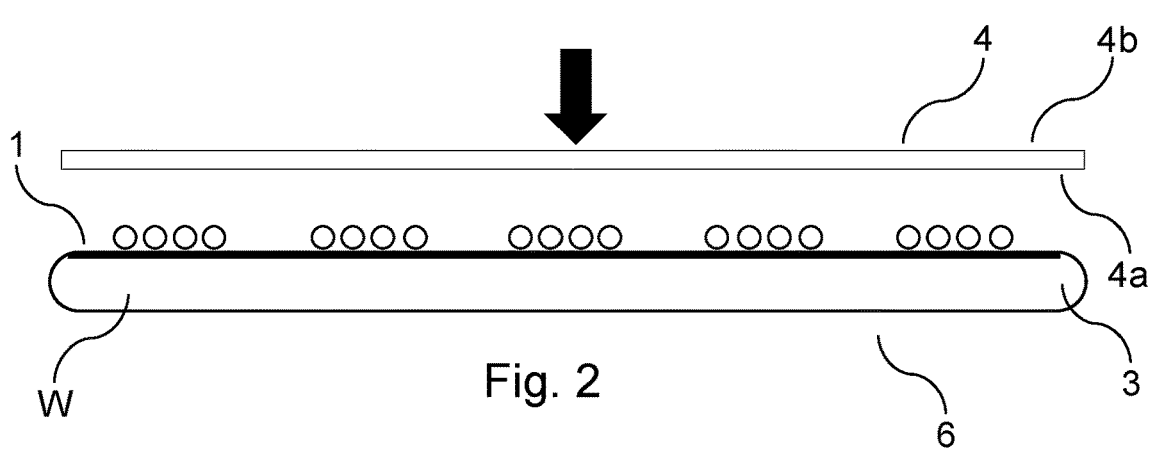
FIG. 2 is a cross-sectional view illustrating a step of applying a protective film to the wafer according to a first embodiment of the method of the present invention.
Figure 3:
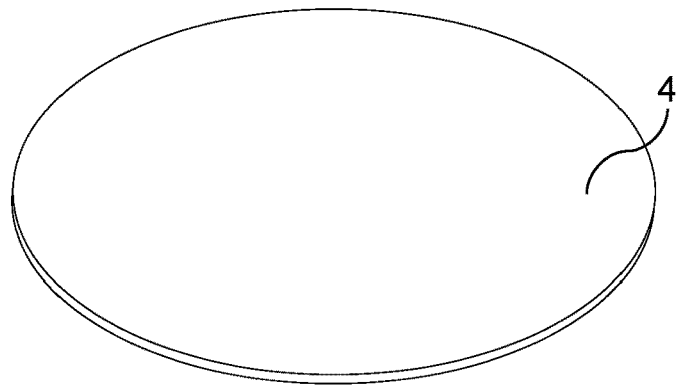
FIG. 3 is a perspective view illustrating the step of applying the protective film to the wafer according to the first embodiment.
Figure 3:
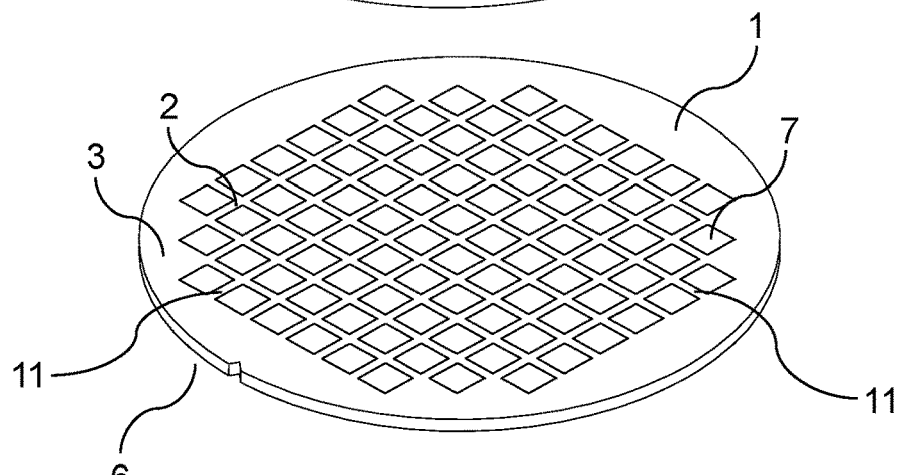

The device area 2 is surrounded by an annular peripheral marginal area 3, as is schematically shown in FIGS. 1 to 3. In this peripheral marginal area 3, no devices are formed. The peripheral marginal area 3 is preferably arranged concentrically to the device area 2 and/or the outer circumference of the wafer W. The radial extension of the peripheral marginal area 3 can be in the mm range and preferably ranges from 1 to 3 mm.

The device area 2 is formed with a plurality of protrusions 14 protruding from a plane surface of the wafer W, as is schematically shown, for example, in FIGS. 1 and 2. The protrusions 14 may be, for example, bumps for establishing an electrical contact with the devices 7 of the device area 2 in the separated chips or dies. The height of the protrusions 14 in the thickness direction of the wafer W may be in the range of 20 to 500 μm.

In the following, a method of processing a wafer W according to a first embodiment of the present invention will be described with reference to FIGS. 1 to 5.

FIG. 1 shows a cross-sectional view of the wafer W to be processed by the method according to the first embodiment of the present invention. FIGS. 2 and 3 illustrate a step of applying a protective film 4 to the wafer W according to this first embodiment. In this step, the protective film 4, for covering the devices 7 on the wafer W, is applied to the front side 1 of the wafer W, as is indicated by an arrow in FIG. 2.

Figure 4:
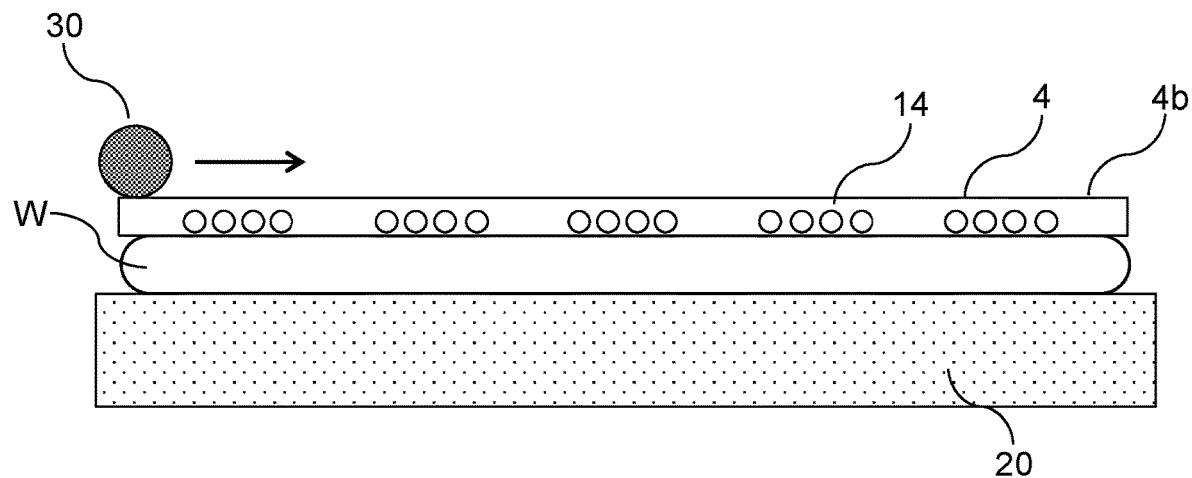
FIG. 4 is a cross-sectional view illustrating steps of applying heat and pressure to the protective film according to the first embodiment.

The protective film 4 preferably has the same shape as the wafer W, i.e., a circular shape in the present embodiment, and is concentrically attached thereto. The diameter of the protective film 4 is approximately the same as that of the wafer W, as is schematically shown in FIGS. 2 to 4.

The protective film 4 covers the devices 7 formed in the device area 2, including the protrusions 14, thus protecting the devices 7 against damage or contamination. Further, the protective film 4 acts as a cushion in subsequent processing of the wafer W, e.g., in a subsequent grinding step, as will be detailed below.

The protective film 4 has a front surface 4*a* and a back surface 4*b,* as is shown in FIG. 2. The protective film 4 is applied to the front side 1 of the wafer W so that the front surface 4*a* of the protective film 4 is in direct contact with the wafer front side 1. Thus, no material, in particular, no adhesive, is present between the front surface 4*a* of the protective film 4 and the front side 1 of the wafer W (see FIGS. 2 to 4).

The protective film 4 is made of a polyolefin. For example, the protective film 4 may be made of polyethylene (PE) or polypropylene (PP).

The protective film 4 may have a thickness in the range of 5 to 200 μm, preferably 80 to 150 μm. For example, the protective film 4 may have a thickness of 80 μm.

After applying the protective film 4 to the front side 1 of the wafer W, the protective film 4 is heated, so that the protective film 4 is attached to the wafer front side 1.

In particular, the wafer W with the protective film 4 applied thereto may be placed on a chuck table 20 (see FIG. 4) and the chuck table 20 may be heated, e.g., to a temperature in the range of 60° C. to 150° C. Particularly preferably, the chuck table 20 is heated to a temperature of approximately 100° C. The chuck table 20 may be heated, for example, over a duration in the range of 1 min to 10 min.

Further, pressure is applied to the back surface 4*b* of the protective film 4 by means of a roller 30, as is shown in FIG. 4. The roller 30 is moved along the back surface 4*b* of the protective film 4, as is indicated by an arrow in FIG. 4, pressing the protective film 4 against the front side 1 of the wafer W.

The roller 30 may be a heated roller. In addition to heating the protective film 4 through the heated chuck table 20, or as an alternative thereto, heat may be applied to the protective film 4 by the heated roller 30.

By heating the protective film 4, using the heated chuck table 20 and/or the heated roller 30, the protective film 4 is attached to the front side 1 of the wafer W.

Specifically, an attachment force between protective film 4 and wafer W, holding the protective film 4 in its position on the wafer W, is generated through the heating process. In particular, by heating the protective film 4, a form fit and/or a material bond is formed between protective film 4 and wafer W.

By applying pressure to the back surface 4*b* of the protective film 4, the front surface 4*a* of the protective film 4 is pressed against the front side 1 of the wafer W. Thus, it can be particularly efficiently ensured that the protective film 4 is reliably attached to the wafer W.

In the attached state of the protective film 4, the protrusions 14 protruding from the plane surface of the wafer W are fully embedded in the protective film 4, as is schematically shown in FIG. 4.

After attaching the protective film 4 to the front side 1 of the wafer W, a back side 6 of the wafer W (see FIGS. 1 to 3), being opposite to the front side 1 thereof, is processed. The back side 6 of the wafer W may be processed by grinding and/or polishing and/or etching and/or cutting. Particularly preferably, the back side 6 of the wafer W is processed by grinding.

In particular, the wafer W, having the protective film 4 attached thereto, may be removed from the chuck table 20 and turned around, so that the wafer back side 6 faces upward. Subsequently, processing of the wafer back side 6, e.g., by grinding, may be performed. Such a grinding step is detailed below for the fourth embodiment of the method of the present invention with reference to FIG. 13.

During processing, such as grinding, the back side 6 of the wafer W, the wafer W can be placed on a support (not shown), such as a chuck table, so that the back surface 4*b* of the protective film 4 is in contact with an upper surface of the support. The protective film 4 reliably protects the wafer W, in particular, the devices 7 and the protrusions 14, from any damage during wafer processing.

After the back side 6 of the wafer W has been ground, the wafer W may be cut along the division lines 11 so as to obtain individual chips or dies (not shown).

For example, the protective film 4 may be removed, e.g., peeled off, from the wafer W after grinding the back side 6 thereof. This removal process may be facilitated, for example, by heating the protective film 4 before and/or during removing it from the wafer W.

Subsequently, the wafer W may be cut along the division lines 11 from the front side 1 thereof. In this way, chips or dies which are fully separated from each other are obtained. Cutting the wafer W may be performed by mechanical cutting, e.g., using a blade or a saw, and/or cutting by laser and/or cutting by plasma.

After the chips or dies have been completely separated from one another in the cutting step, they can be picked up, e.g., by using a pick-up device (not shown). The spacing between the individual chips or dies can be increased prior to the pick-up process, in order to facilitate the pick-up process.

Figure 5:
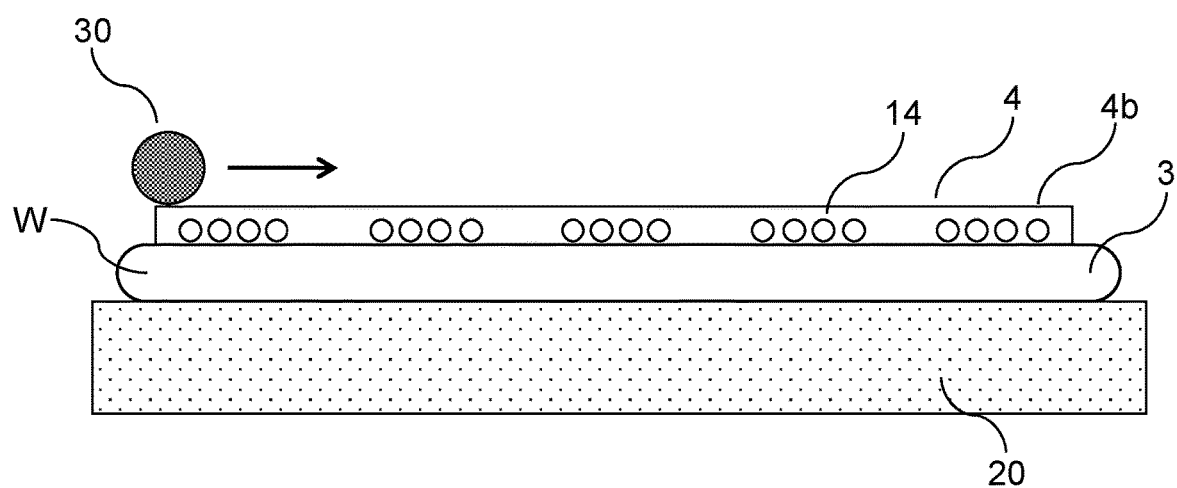
FIG. 5 is a cross-sectional view illustrating steps of applying heat and pressure to the protective film according to a modification of the first embodiment.

FIG. 5 illustrates steps of applying heat and pressure to the protective film 4 according to a modification of the first embodiment of the method of the present invention. This modification differs from the first embodiment only in that the diameter of the protective film 4 is smaller than the outer diameter of the wafer W. In particular, the diameter of the protective film 4 may be substantially the same as an outer diameter of the device area 2.

In the following, a method of processing a wafer W according to a second embodiment of the present invention will be described with reference to FIGS. 6 to 8.

Figure 6:
FIG. 6 is a cross-sectional view showing a protective film and an annular frame used in a second embodiment of the method of the present invention.
Figure 7:
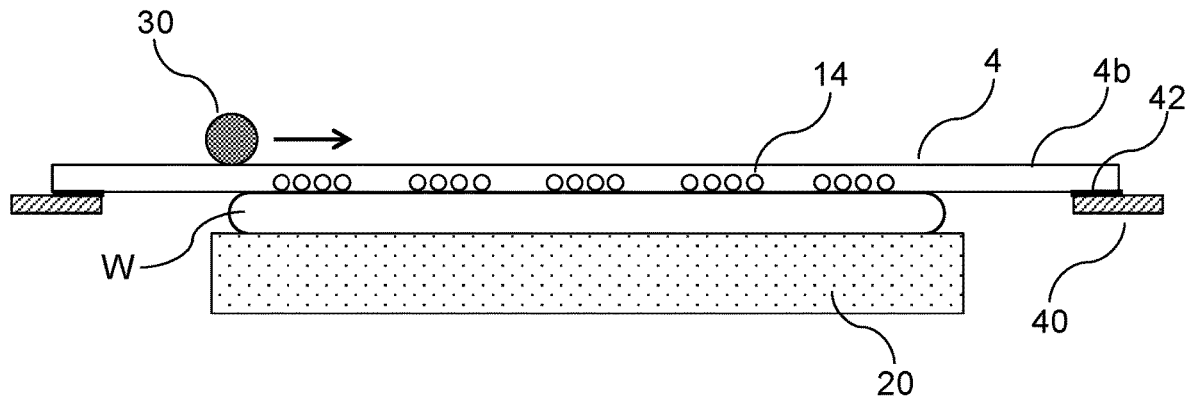
FIG. 7 is a cross-sectional view illustrating steps of applying heat and pressure to the protective film according to the second embodiment.
Figure 8:
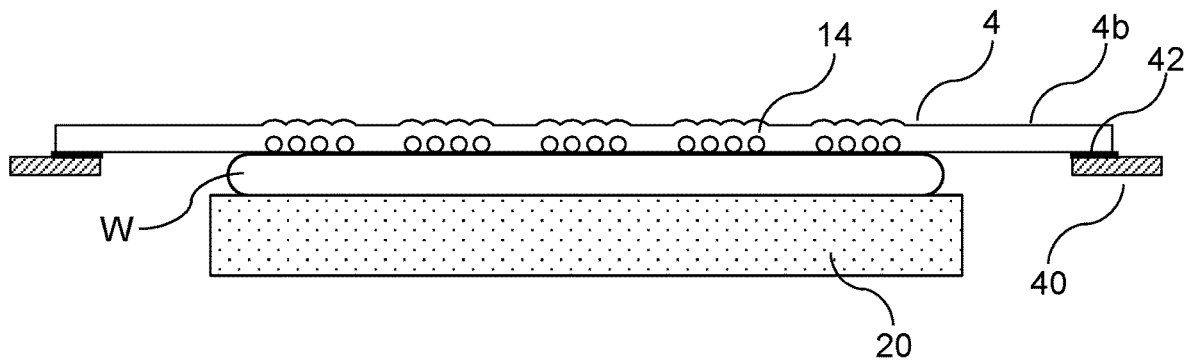
FIG. 8 is a cross-sectional view showing the outcome of the steps of applying heat and pressure to the protective film illustrated in FIG. 7.

The method according to the second embodiment differs from the method according to the first embodiment in that the diameter of the protective film 4 is larger than the outer diameter of the wafer W and an outer peripheral portion of the protective film 4 is attached to an annular frame 40 (see FIGS. 6 to 8). In the description of the second embodiment, the elements which are substantially identical to those of the first embodiment are denoted by the same reference signs and a repeated detailed description thereof is omitted.

FIG. 6 shows the protective film 4 and the annular frame 40 prior to the attachment of the protective film 4 to the annular frame 40. The attached state of the protective film 4 and the annular frame 40 is illustrated in FIGS. 7 and 8.

In particular, the outer peripheral portion of the protective film 4 is attached to the annular frame 40 so that the protective film 4 closes a central opening of the annular frame 40. In this way, the wafer W, which is attached to the protective film 4, in particular, to a central portion thereof, is held by the annular frame 40 through the protective film 4. Thus, a wafer unit, comprising the wafer W, the protective film 4 and the annular frame 40, is formed, facilitating processing, handling and/or transport of the wafer W (see FIGS. 7 and 8).

In the present embodiment, the step of attaching the outer peripheral portion of the protective film 4 to the annular frame 40 is preferably performed before applying the protective film 4 to the wafer W. In this way, the step of applying the protective film 4 to the wafer W can be further facilitated, e.g., using the annular frame 40 for handling and transporting the wafer W.

As is shown in FIGS. 6 to 8, the outer peripheral portion of the protective film 4 is attached to the annular frame 40 through an annular adhesive layer 42. The adhesive layer 42 is arranged between the protective film 4 and the annular frame 40.

After applying the protective film 4 to the wafer W, heat and pressure are applied to the protective film 4 in the same manner as detailed above for the first embodiment with reference to FIG. 4, thereby attaching the protective film 4 to the wafer W (see FIG. 7).

FIG. 8 shows the outcome of the steps of applying heat and pressure to the protective film 4 illustrated in FIG. 7. As is indicated in FIG. 8, the wafer topography originating from the protrusions 14 is not fully absorbed by the protective film 4. Thus, a surface unevenness is generated on the back surface 4b of the protective film 4. Such a surface unevenness may occur for the case of protrusions 14 with relatively large heights. In this case, if it is desired to fully absorb the wafer topography, a cushioning layer may be provided on the back surface 4b of the protective film 4, as will be detailed below for the fourth to eighth embodiments of the method according to the present invention.

After attaching the protective film 4 to the wafer W, the wafer W may be processed substantially in the same manner as detailed above for the first embodiment.

In the following, a method of processing a wafer W according to a third embodiment of the present invention will be described with reference to FIG. 9.

The method according to the third embodiment differs from the method according to the first embodiment in the process of applying the protective film 4 to the wafer W and in the process of applying pressure to the back surface 4b of the protective film 4. In the description of the third embodiment, the elements which are substantially identical to those of the previous embodiments are denoted by the same reference signs and a repeated detailed description thereof is omitted.

Figure 9:
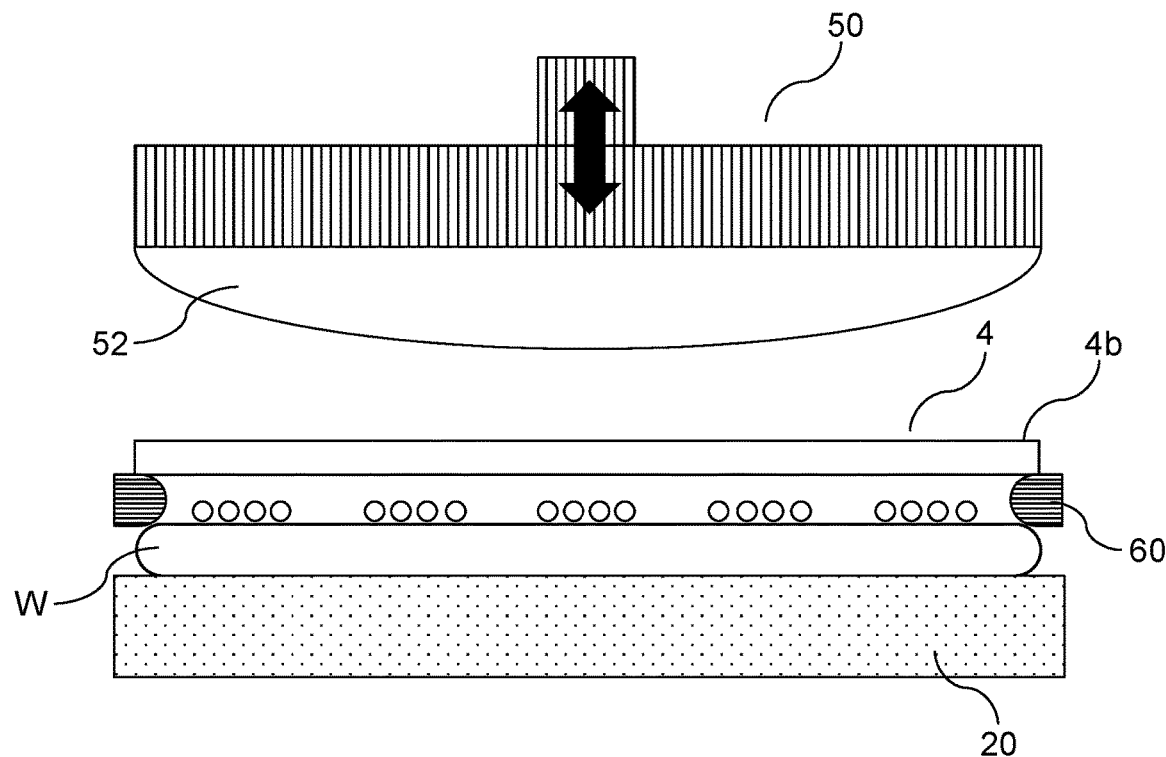
FIG. 9 is a cross-sectional view illustrating steps of applying heat and pressure to the protective film according to a third embodiment of the method of the present invention.

In particular, the protective film 4 is applied to the front side 1 of the wafer W by using a vacuum laminator, as is illustrated in FIG. 9. In this vacuum laminator, the wafer W is placed on a chuck table 20 in a vacuum chamber (not shown) in a state in which the wafer back side 6 is in contact with an upper surface of the chuck table 20 and the wafer front side 1 is oriented upward. The chuck table 20 is a heated chuck table.

The protective film 4 is held at its peripheral portion by an annular spacer 60 arranged between the wafer front side 1 and the protective film 4. In this way, the protective film 4 is placed above the wafer front side 1 in the vacuum chamber (see FIG. 9). An upper part of the vacuum chamber which is situated above the chuck table 20 and the protective film 4 is provided with an air inlet port 50 closed by an expandable rubber membrane 52.

After the wafer W and the protective film 4 have been loaded into the vacuum chamber, the chamber is evacuated and air is supplied through the air inlet port 50 to the rubber membrane 52, causing the rubber membrane 52 to expand into the evacuated chamber. In this way, the rubber membrane 52 is moved downward in the vacuum chamber, as indicated by an arrow in FIG. 9, so as to push the protective film 4 against the wafer front side 1, pressing the protective film 4 against the device area 7 on the wafer front side 1. Hence, the protective film 4 can be applied closely to the wafer front side 1, so as to follow the contours of the device area 7, in particular, the contours of the protrusions 14 present therein.

The protective film 4 is heated during and/or after application thereof to the wafer front side 1 by heating the chuck table 20.

The rubber membrane 52 is further used to apply pressure to the back surface 4b of the protective film 4 after application thereof to the wafer W. In this way, it can be particularly efficiently ensured that the protective film 4 is reliably attached to the wafer W.

Subsequently, the vacuum in the vacuum chamber is released and the protective film 4 is held in its position on the wafer front side 1 by the attachment force generated through the heating process and the positive pressure in the vacuum chamber.

Alternatively, the rubber membrane 52 can be replaced by a soft stamp or a soft roller, e.g., a heated soft stamp or a heated soft roller.

After attaching the protective film 4 to the wafer W, the wafer W may be processed substantially in the same manner as detailed above for the first embodiment.

In the following, a method of processing a wafer W according to a fourth embodiment of the present invention will be described with reference to FIGS. 10 to 13.

Figure 10:
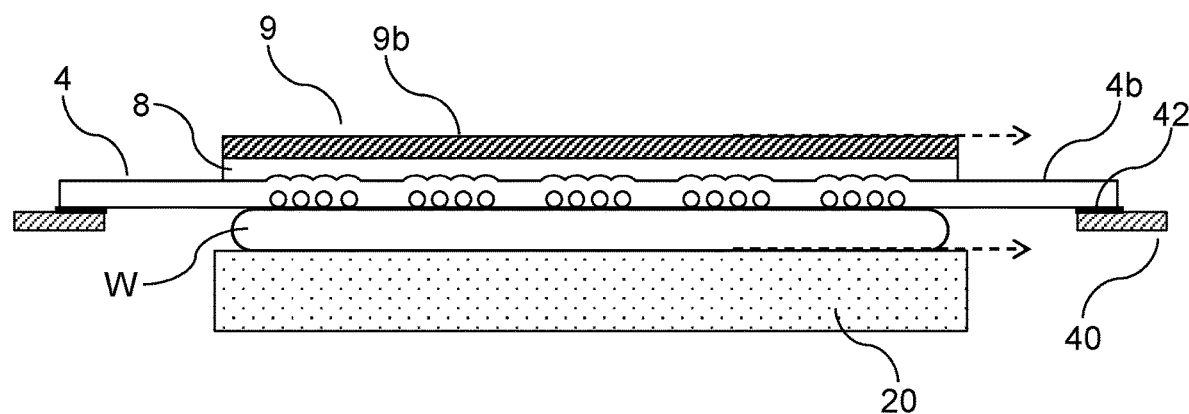
FIG. 10 is a cross-sectional view showing the outcome of steps of applying heat and pressure to the protective film according to a fourth embodiment of the method of the present invention.

The method according to the fourth embodiment differs from the method according to the second embodiment in that a cushioning layer 8 and a base sheet 9 are provided on the back surface 4b of the protective film 4 (see, for example, FIG. 10). In the description of the fourth embodiment, the elements which are substantially identical to those of the previous embodiments are denoted by the same reference signs and a repeated detailed description thereof is omitted.

In particular, the cushioning layer 8 is attached to the back surface 4b of the protective film 4, so that a front surface of the cushioning layer 8 is in direct contact with the back surface 4b of the protective film 4.

As is shown in FIG. 10, the protrusions 14 are embedded in the protective film 4 and the cushioning layer 8. Hence, the wafer topography is fully absorbed.

The cushioning layer 8 may be formed of a resin, an adhesive, a gel or the like. The cushioning layer 8 may have a thickness in the range of 20 to 300 μm.

The base sheet 9 is attached to a back surface of the cushioning layer 8, so that a front surface of the base sheet 9 is in direct contact with the back surface of the cushioning layer 8.

The material of the base sheet 9 is not particularly limited.

The base sheet 9 may be made of a soft or pliable material, such as, for example, a polymer material, e.g., polyvinyl chloride (PVC) or ethylene vinyl acetate (EVA).

Alternatively, the base sheet 9 may be made of a rigid or hard material, such as polyethylene terephthalate (PET) and/or silicon and/or glass and/or stainless steel (SUS).

For example, if the base sheet 9 is made of polyethylene terephthalate (PET) or glass and the cushioning layer 8 is curable by an external stimulus, the cushioning layer 8 may be cured with radiation that is transmittable through polyethylene terephthalate (PET) or glass, for instance UV radiation. If the base sheet 9 is made of silicon or stainless steel (SUS), a cost-efficient base sheet 9 is provided.

Also, the base sheet 9 may be formed of a combination of the materials listed above.

The base sheet 9 may have a thickness in the range of 30 to 1500 μm, preferably 40 to 1200 μm and more preferably 50 to 1000 μm. Particularly preferably, the base sheet 9 has a thickness in the range of 30 to 250 μm. A thickness of the base sheet 9 of 50 μm is especially preferred. For example, the base sheet 9 may be a polyethylene terephthalate (PET) film with a thickness of 50 μm.

The base sheet 9 and the cushioning layer 8 each have a substantially circular shape. The diameters of the base sheet 9 and the cushioning layer 8 are substantially identical to each other and larger than the diameter of the wafer W. The diameters of the base sheet 9 and the cushioning layer 8 are smaller than the diameter of the protective film 4.

The cushioning layer 8 and the base sheet 9 may be attached to the back surface 4b of the protective film 4 before or after applying the protective film 4 to the front side 1 of the wafer W. In particular, the protective film 4, the cushioning layer 8 and the base sheet 9 may be laminated first, forming a protective sheeting comprising the base sheet 9, the cushioning layer 8 and the protective film 4 attached to the cushioning layer 8. The protective sheeting formed in this manner may be subsequently applied to the front side 1 of the wafer W, so that the front surface 4a of the protective film 4 is in direct contact with the wafer front side 1.

Subsequently, the protective film 4 is heated so as to attach the protective sheeting to the front side 1 of the wafer W. The protective film 4 may be heated substantially in the same manner as detailed above for the first embodiment, i.e., by means of the heated chuck table 20 (see FIG. 10).

Further, pressure is applied to a back surface 9b of the base sheet 9 by using two parallel pressing plates. In the pressure application process, one plate presses against the back surface 9b of the base sheet 9 and the other plate presses against the back side 6 of the wafer W. In this way, it can be ensured that the back surface 9b of the base sheet 9 is substantially parallel to the wafer back side 6, as is indicated by dashed arrows in FIG. 10.

The pressing plates may be heated pressing plates, allowing for the protective film 4 to be heated during the pressing process through the wafer W and/or through the base sheet 9 and the cushioning layer 8. This heating process may be performed in addition or as an alternative to heating the protective film 4 by means of the heated chuck table 20.

The cushioning layer 8 may be curable by an external stimulus, such as UV radiation, heat, an electric field and/or a chemical agent. In this case, the cushioning layer 8 hardens at least to some degree upon application of the external stimulus thereto. For example, the cushioning layer 8 may be formed of a curable resin, a curable adhesive, a curable gel or the like.

Preferred examples of UV curable resins for use as the cushioning layer 8 in the present embodiment are ResiFlat by the DISCO Corporation and TEMPLOC by DENKA.

The method of the present embodiment may further comprise applying the external stimulus to the cushioning layer 8 so as to cure the cushioning layer 8, after applying the protective film 4 to the front side 1 of the wafer W. The external stimulus may be applied to the cushioning layer 8 after attaching the protective film 4 to the wafer front side 1.

The external stimulus may be applied to the cushioning layer 8 before processing, e.g., grinding, the wafer back side 6. In this way, the protection of the wafer W during processing and the processing accuracy can be further improved.

Figure 11:
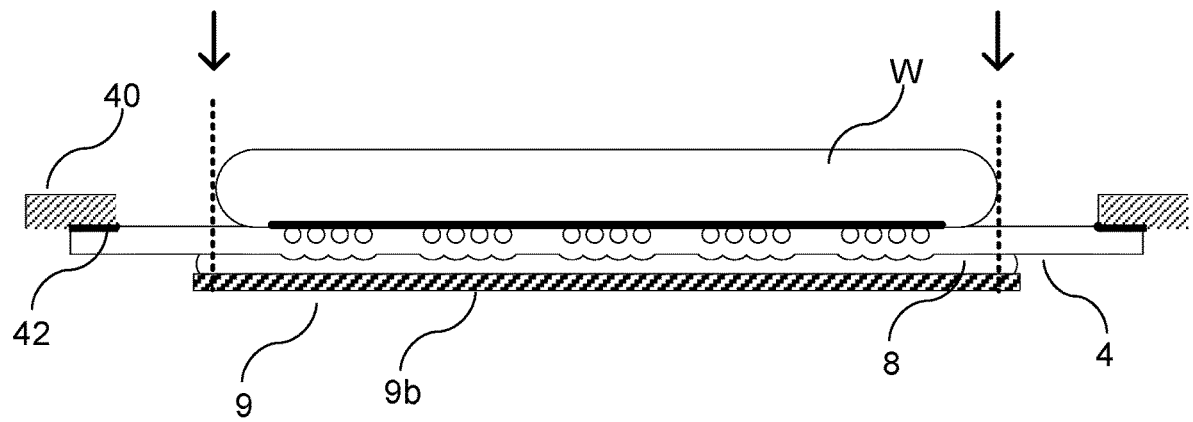
FIG. 11 is a cross-sectional view illustrating a step of cutting off a portion of the protective film according to the fourth embodiment.

FIG. 11 illustrates a subsequent step of cutting off portions of the protective film 4, the cushioning layer 8 and the base sheet 9 which laterally extend beyond the circumference of the wafer W, as is indicated by dashed lines and arrows in FIG. 11. These portions may be cut off, for example, by mechanical cutting, e.g., using a blade or a saw, laser cutting or plasma cutting. Cutting off these portions facilitates handling of the wafer unit in subsequent processing steps.

Figure 12:
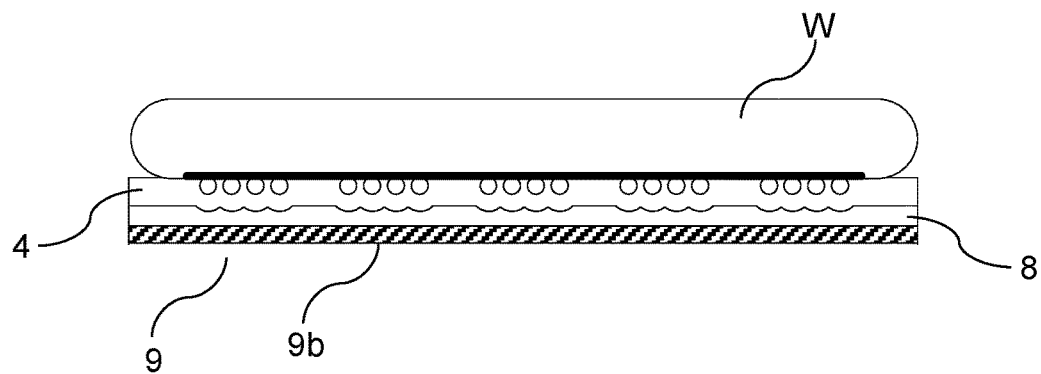
FIG. 12 is a cross-sectional view showing the outcome of the step of cutting off a portion of the protective film illustrated in FIG. 11.

FIG. 12 shows the outcome of the cutting step illustrated in FIG. 11.

After this cutting step, the back side 6 of the wafer W is processed, i.e., subjected to a grinding process, as will be detailed in the following.

Figure 13:
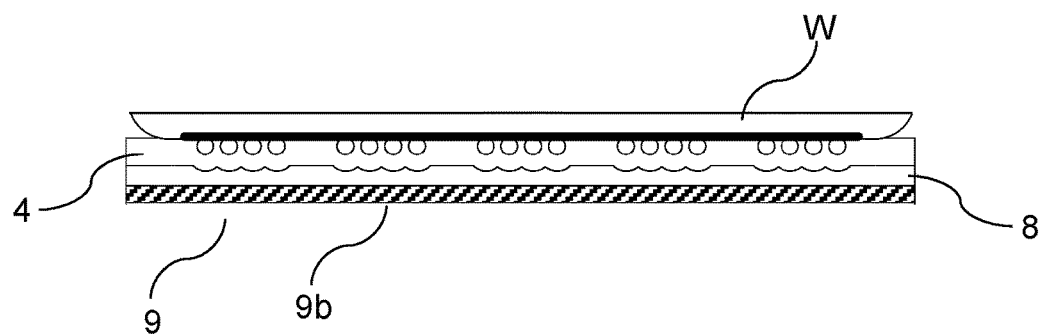
FIG. 13 is a cross-sectional view showing the outcome of a step of grinding the wafer back side according to the fourth embodiment.

The back surface 9b of the base sheet 9, which is a plane, flat surface, is placed on the top surface of a chuck table (not shown) which may be identical to the chuck table 20 in FIG. 10. Subsequently, the back side 6 of the wafer W is ground for adjusting the wafer thickness, e.g., to a value in the range of approximately 20 to 100 μm. The thickness can be the final thickness of the chips or dies. FIG. 13 shows the outcome of this grinding step.

The grinding of the back side 6 of the wafer W may be performed using a grinding apparatus (not shown). The grinding apparatus may comprise a spindle housing, a spindle rotatably accommodated in the spindle housing and a grinding wheel mounted to the lower end of the spindle. A plurality of abrasive members may be fixed to the lower surface of the grinding wheel, wherein each abrasive member may be formed from a diamond abrasive member configured by fixing diamond abrasive grains with a bond, such as a metal bond or a resin bond. The grinding wheel having the abrasive members is rotated at high speeds by driving the spindle, e.g., using a motor.

In the grinding step, the chuck table holding the wafer unit and the grinding wheel of the grinding apparatus are rotated and the grinding wheel is lowered so as to bring the abrasive members of the grinding wheel into contact with the back side 6 of the wafer W, thereby grinding the back side 6.

Since the plane back surface 9b of the base sheet 9, which is placed on the top surface of the chuck table of the grinding apparatus, is substantially parallel to the back side 6 of the wafer W (see FIG. 10), the pressure applied to the wafer W by the grinding wheel during the grinding process is evenly and homogenously distributed over the wafer W. Hence, any risk of a pattern transfer or breakage of the wafer W can be minimised. Further, the substantially parallel alignment of the flat, even back surface 9b of the base sheet 9 and the back side 6 of the wafer W allows for the grinding step to be carried out with a high degree of precision, thus achieving a particularly uniform and homogenous wafer thickness after grinding.

The further processing of the wafer W, i.e., the cutting thereof and the picking up of the separated chips or dies, may be performed substantially in the same manner as detailed above for the first embodiment.

Figure 14:
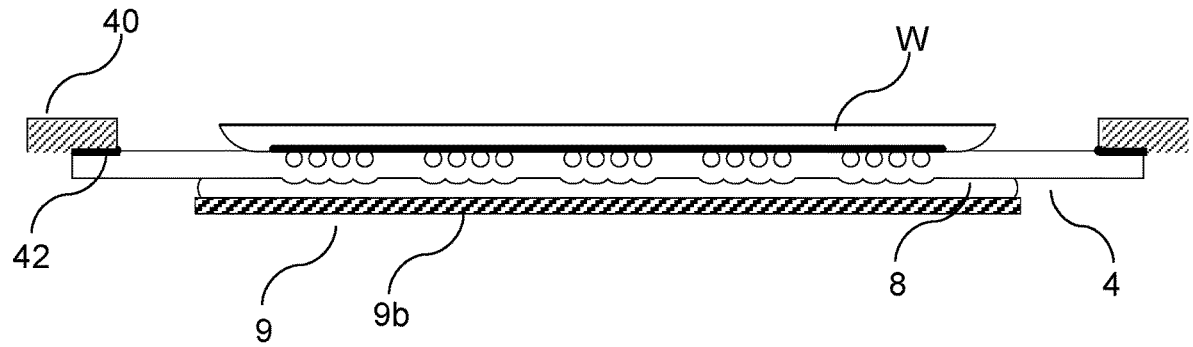
FIG. 14 is a cross-sectional view showing the outcome of a step of grinding the wafer back side according to a fifth embodiment of the method of the present invention.
Figure 15:
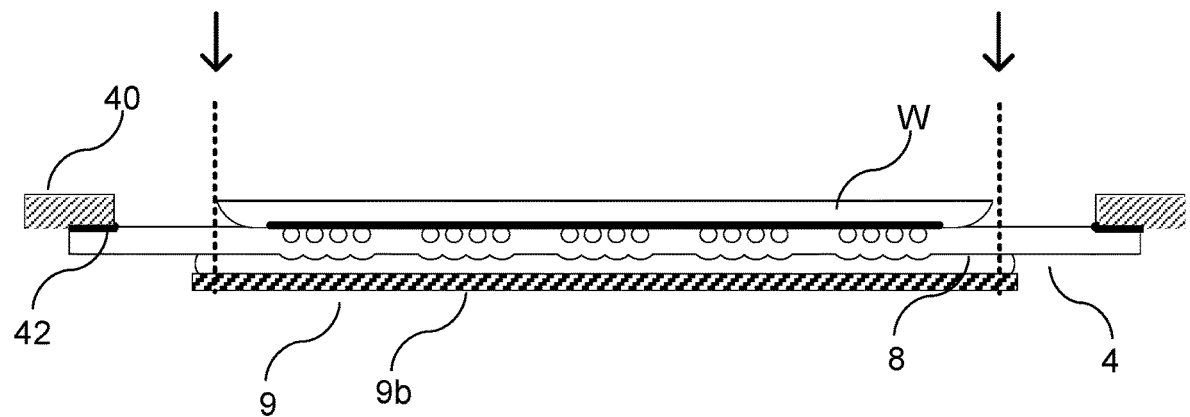
FIG. 15 is a cross-sectional view illustrating a step of cutting off a portion of the protective film according to the fifth embodiment.
Figure 16:
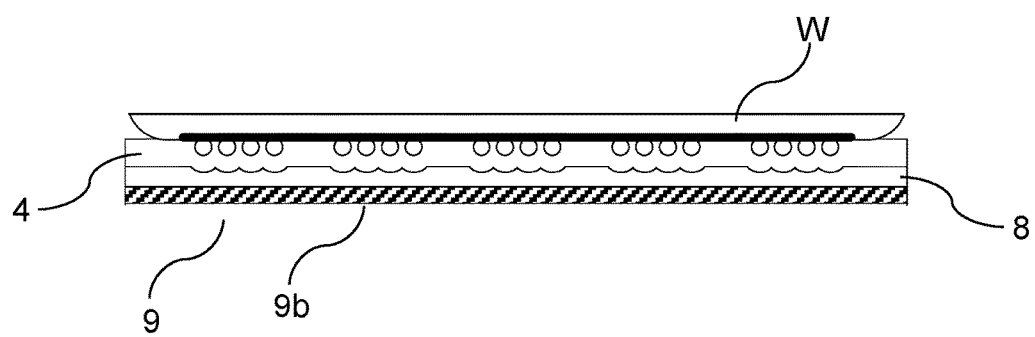
FIG. 16 is a cross-sectional view showing the outcome of the step of cutting off a portion of the protective film illustrated in FIG. 15.

In the following, a method of processing a wafer W according to a fifth embodiment of the present invention will be described with reference to FIGS. 14 to 16.

The method according to the fifth embodiment differs from the method according to the fourth embodiment in the order of the steps of cutting the protective film 4 and grinding the wafer back side 6. In the description of the fifth embodiment, the elements which are substantially identical to those of the previous embodiments are denoted by the same reference signs and a repeated detailed description thereof is omitted.

In particular, in the method of the fifth embodiment, the back side 6 of the wafer W is ground first, while the protective film 4 is still attached to the annular frame 40. The outcome of this grinding step is shown in FIG. 14. The wafer back side 6 is ground substantially in the same manner as detailed above for the fourth embodiment with reference to FIG. 13.

Subsequently, portions of the protective film 4, the cushioning layer 8 and the base sheet 9 which laterally extend beyond the circumference of the wafer W are cut off, as is indicated by dashed lines and arrows in FIG. 15. This cutting step is carried out substantially in the same manner as detailed above for the fourth embodiment with reference to FIG. 11. FIG. 16 shows the outcome of the cutting step illustrated in FIG. 15.

The further processing of the wafer W, i.e., the cutting thereof and the picking up of the separated chips or dies, may be performed substantially in the same manner as detailed above for the first embodiment.

In the following, a method of processing a wafer W according to a sixth embodiment of the present invention will be described with reference to FIGS. 17 and 18.

Figure 17:
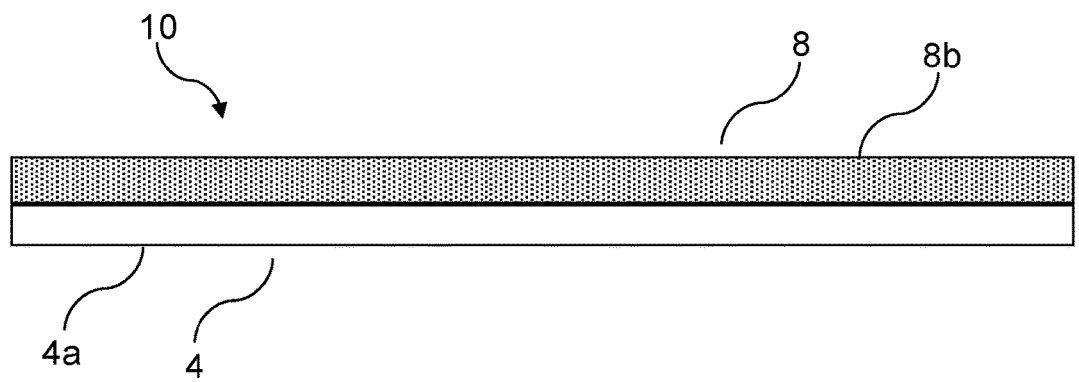
FIG. 17 is a cross-sectional view showing a protective film and a cushioning layer used in a sixth embodiment of the method of the present invention.
Figure 18:
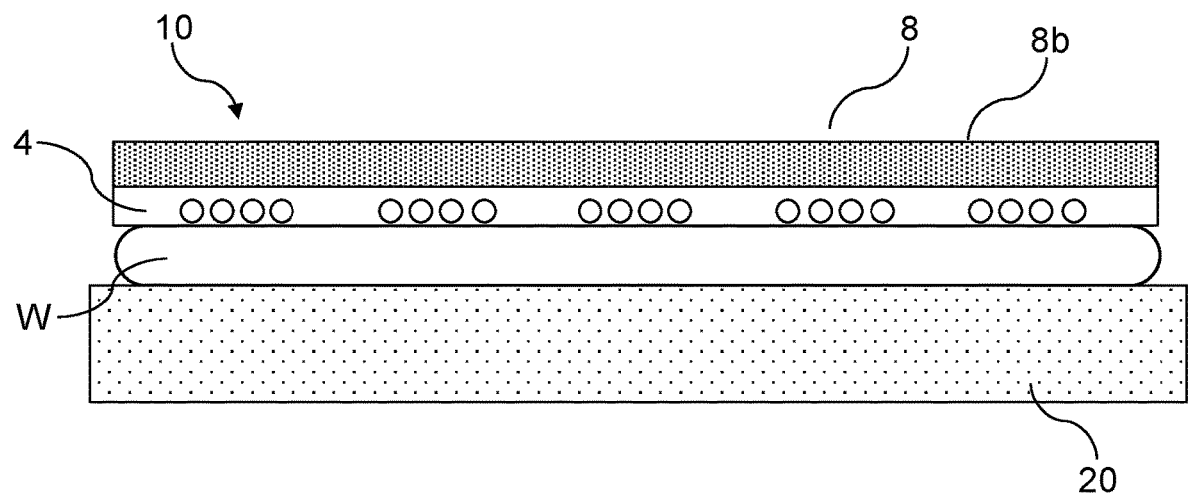
FIG. 18 is a cross-sectional view showing the outcome of steps of applying heat and pressure to the protective film according to the sixth embodiment.

The method according to the sixth embodiment differs from the method according to the first embodiment in that a cushioning layer 8 is provided on the back surface 4b of the protective film 4 (see FIGS. 17 and 18). Moreover, the method according to the sixth embodiment differs from the methods according to the fourth and fifth embodiments, inter alia, in that no base sheet is provided on a back surface 8b of the cushioning layer 8. In the description of the sixth embodiment, the elements which are substantially identical to those of the previous embodiments are denoted by the same reference signs and a repeated detailed description thereof is omitted.

In the method of the sixth embodiment, a protective sheeting 10 is formed by attaching the cushioning layer 8 to the back surface 4b of the protective film 4, as is shown in FIG. 17. The protective sheeting 10 thus comprises the protective film 4 and the cushioning layer 8 attached thereto. The cushioning layer 8 may have the same properties and characteristics as detailed above for the fourth embodiment.

The diameters of the protective film 4 and the cushioning layer 8 are substantially identical to each other and identical to the diameter of the wafer W (see FIG. 18).

The protective sheeting 10 is applied to the front side 1 of the wafer W so that the front surface 4a of the protective film 4 is in direct contact with the wafer front side 1. Subsequently, the protective film 4 is heated so as to attach the protective sheeting 10 to the front side 1 of the wafer W. The protective film 4 may be heated substantially in the same manner as detailed above for the first embodiment, i.e., by means of the heated chuck table 20 (see FIG. 18).

Further, pressure is applied to the back surface 8b of the cushioning layer 8 by using two parallel pressing plates. In the pressure application process, one plate presses against the back surface 8b of the cushioning layer 8 and the other plate presses against the back side 6 of the wafer W. In this way, it can be ensured that the back surface 8b of the cushioning layer 8 is substantially parallel to the wafer back side 6.

The pressing plates may be heated pressing plates, allowing for the protective film 4 to be heated during the pressing process through the wafer W and/or through the cushioning layer 8. This heating process may be performed in addition or as an alternative to heating the protective film 4 by means of the heated chuck table 20.

The outcome of the steps of applying heat and pressure to the protective film 4 is shown in FIG. 18. As is indicated in this figure, the wafer topography originating from the protrusions 14 is fully absorbed by the protective film 4 and the cushioning layer 8.

The cushioning layer 8 may be made of a curable material and may be cured substantially in the same manner as detailed above for the fourth embodiment.

Subsequently, the back side 6 of the wafer W is ground substantially in the same manner as detailed above for the fourth embodiment.

The further processing of the wafer W, i.e., the cutting thereof and the picking up of the separated chips or dies, may be performed substantially in the same manner as detailed above for the first embodiment.

In the following, a method of processing a wafer W according to a seventh embodiment of the present invention will be described with reference to FIGS. 19 to 21.

The method according to the seventh embodiment differs from the method according to the sixth embodiment in that the base sheet 9 is attached to the back surface 8b of the cushioning layer 8. In the description of the seventh embodiment, the elements which are substantially identical to those of the previous embodiments are denoted by the same reference signs and a repeated detailed description thereof is omitted.

Figure 19:
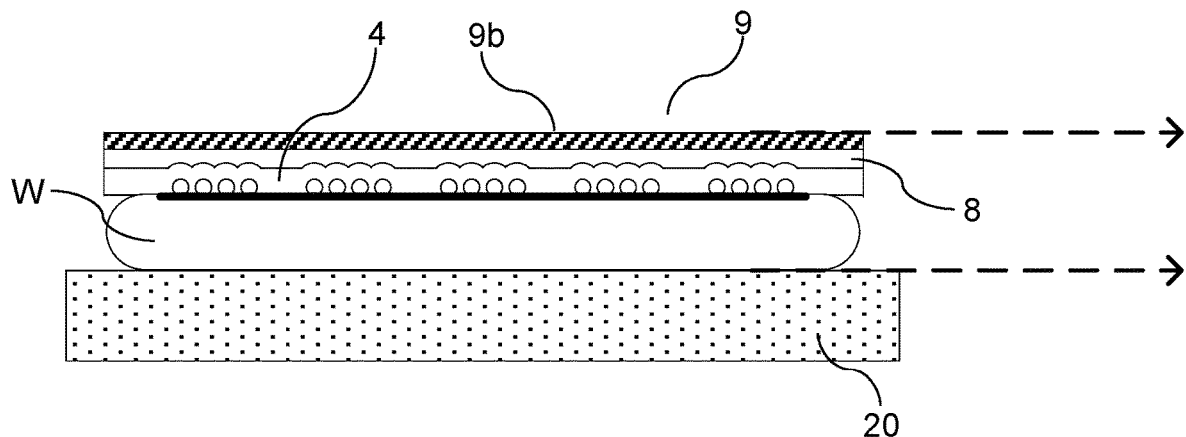
FIG. 19 is a cross-sectional view showing the outcome of steps of applying heat and pressure to the protective film according to a seventh embodiment of the method of the present invention.

The base sheet 9 is attached to the back surface 8b of the cushioning layer 8 so that the front surface of the base sheet 9 is in direct contact with the back surface 8b of the cushioning layer 8 (see FIG. 19). The base sheet 9 may have the same properties and characteristics as detailed above for the fourth embodiment.

The diameters of the protective film 4, the cushioning layer 8 and the base sheet 9 are substantially identical to each other and identical to the diameter of the wafer W (see FIG. 19).

The protective film 4, the cushioning layer 8 and the base sheet 9 may be attached to the wafer front side 1 substantially in the same manner as detailed above for the fourth embodiment.

The outcome of this attachment process is shown in FIG. 19. The back surface 9b of the base sheet 9 is substantially parallel to the back side 6 of the wafer W, as is indicated by dashed arrows in FIG. 19.

Subsequently, the back side 6 of the wafer W is ground substantially in the same manner as detailed above for the fourth embodiment.

The further processing of the wafer W, i.e., the cutting thereof and the picking up of the separated chips or dies, may be performed substantially in the same manner as detailed above for the first embodiment.

Figure 20:
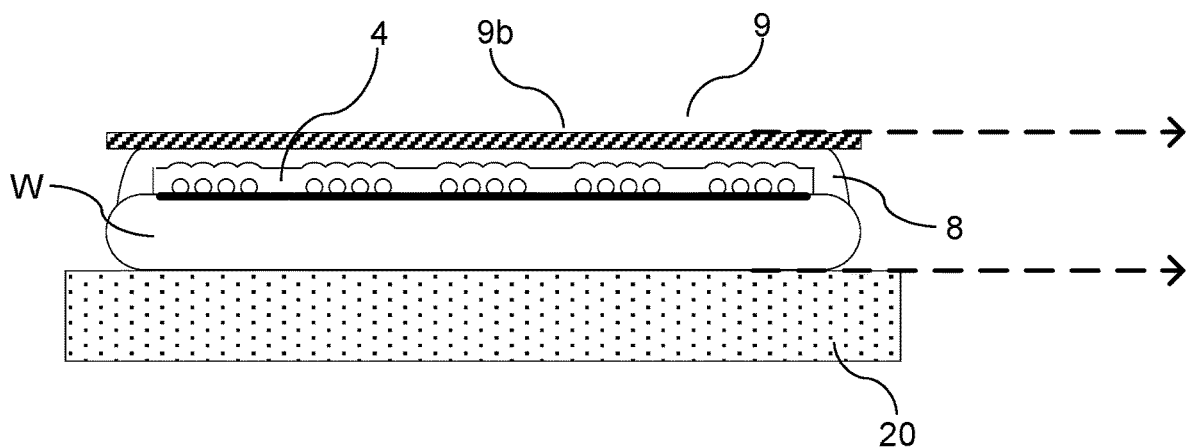
FIG. 20 is a cross-sectional view showing the outcome of steps of applying heat and pressure to the protective film according to a modification of the seventh embodiment of the method of the present invention.
Figure 21:
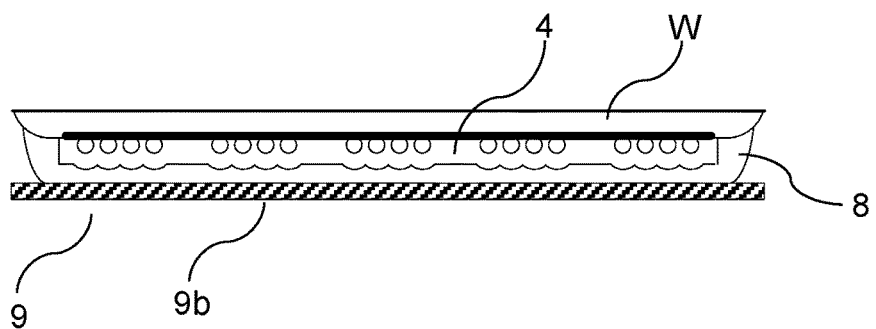
FIG. 21 is a cross-sectional view showing the outcome of a step of grinding the wafer back side according to the modification of the seventh embodiment.

FIGS. 20 and 21 show a modification of the seventh embodiment of the method of the present invention. This modification differs from the seventh embodiment mainly in that the protective film 4 has a smaller diameter than the cushioning layer 8 and the cushioning layer 8 reaches over the protective film 4.

Specifically, the protective film 4 has a diameter which is substantially the same as the diameter of the device area 2 of the wafer W (see FIGS. 20 and 21).

The protective film 4, the cushioning layer 8 and the base sheet 9 may be attached to the wafer front side 1 substantially in the same manner as detailed above for the fourth embodiment. The outcome of this attachment process is shown in FIG. 20.

As is illustrated in this figure, the cushioning layer 8 surrounds an outer circumference of the protective film 4 and is in direct contact with the wafer front side 1. This arrangement provides an especially stable and robust attachment of the protective sheeting, in particular, the protective film 4, to the wafer front side 1. The strength of this attachment may be further enhanced by curing the cushioning layer 8.

Subsequently, the back side 6 of the wafer W is ground substantially in the same manner as detailed above for the fourth embodiment. The outcome of this grinding process is shown in FIG. 21.

The further processing of the wafer W, i.e., the cutting thereof and the picking up of the separated chips or dies, may be performed substantially in the same manner as detailed above for the first embodiment.

In the following, a method of processing a wafer W according to an eighth embodiment of the present invention will be described with reference to FIGS. 22 and 23.

Figure 22:
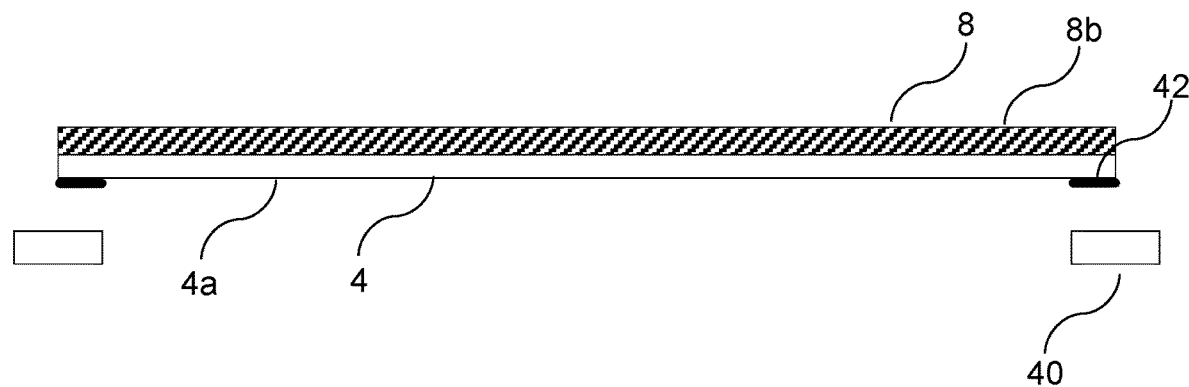
FIG. 22 is a cross-sectional view showing a protective film, a cushioning layer and an annular frame used in an eighth embodiment of the method of the present invention.

The method according to the eighth embodiment differs from the method according to the second embodiment in that the cushioning layer 8 is provided on the back surface 4b of the protective film 4 (see, for example, FIG. 22). In the description of the eighth embodiment, the elements which are substantially identical to those of the previous embodiments are denoted by the same reference signs and a repeated detailed description thereof is omitted.

The cushioning layer 8 may be attached to the back surface 4b of the protective film 4 substantially in the same manner as detailed above for the fourth embodiment.

Figure 23:
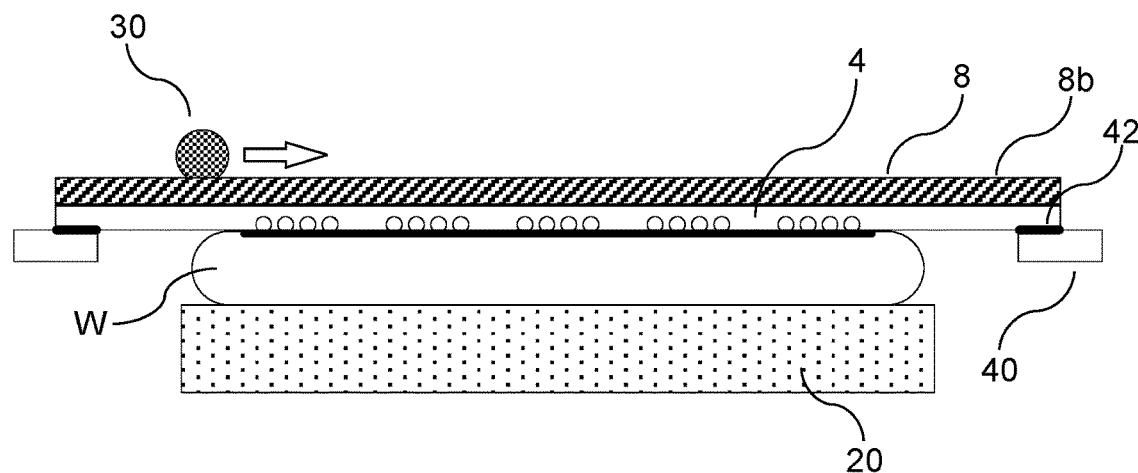
FIG. 23 is a cross-sectional view illustrating steps of applying heat and pressure to the protective film according to the eighth embodiment.

The diameters of the protective film 4 and the cushioning layer 8 are substantially identical to each other and larger than the diameter of the wafer W (see FIG. 23).

The protective sheeting, comprising the protective film 4 and the cushioning layer 8, is attached to the wafer front side 1 substantially in the same manner as detailed above for the protective film 4 of the second embodiment. In particular, after applying the protective sheeting to the wafer front side 1, the protective sheet 4 is heated by the heated chuck table 20 and/or the heated roller 30 (see FIG. 23). Further, pressure is applied to the back surface 8b of the cushioning layer 8 by means of the roller 30.

After attaching the protective sheeting to the front side 1 of the wafer W, the back side 6 of the wafer W is ground substantially in the same manner as detailed above for the fourth embodiment.

The further processing of the wafer W, i.e., the cutting thereof and the picking up of the separated chips or dies, may be performed substantially in the same manner as detailed above for the first embodiment.

In the following, a method of processing a wafer W according to a ninth embodiment of the present invention will be described with reference to FIG. 24.

The method according to the ninth embodiment differs from the method according to the first embodiment, inter alia, in that an adhesive layer 12 is provided at the peripheral portions of the protective film 4 and the wafer W. In the description of the ninth embodiment, the elements which are substantially identical to those of the previous embodiments are denoted by the same reference signs and a repeated detailed description thereof is omitted.

Figure 24:
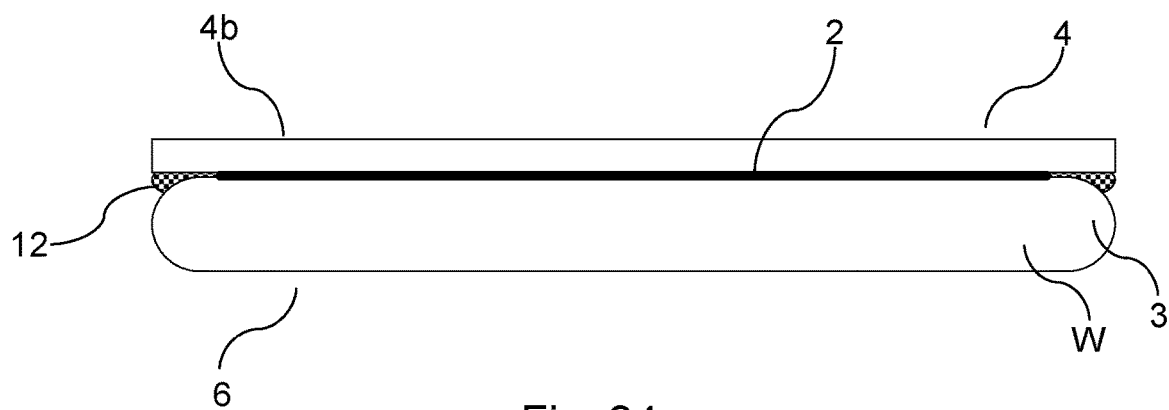
FIG. 24 is a cross-sectional view showing the outcome of steps of dispensing an adhesive and applying a protective film to the wafer according to a ninth embodiment of the method of the present invention.

While protrusions or projections projecting from the plane surface of the wafer W, such as the protrusions 14 detailed above, are omitted in FIG. 24, such protrusions or projections may be present in the device area 7 of the wafer W.

In the method of the ninth embodiment, a liquid adhesive is dispensed onto the protective film 4 and/or onto the wafer W, e.g., by means of a dispenser (not shown), before applying the protective film 4, for covering the devices 7 on the wafer W, to the front side 1 of the wafer W. In this way, an adhesive layer 12 is formed, as is shown in FIG. 24. The liquid adhesive is dispensed only onto the peripheral portion of the protective film 4 and/or only onto the peripheral portion of the wafer W. The adhesive layer 12 has an annular shape. The adhesive layer 12 is arranged so that no adhesive is present in the device area 2 of the wafer W.

The liquid adhesive may be, for example, a liquid adhesive produced by Brewer Science, such as the Brewer-BOND® 220 Material.

The dispenser may be, for example, a dispenser produced by Musashi Engineering, such as the dispenser ML-5000XII.

The adhesive layer 12 may be a continuous adhesive layer. Alternatively, the adhesive layer 12 may be a discontinuous adhesive layer. In particular, in the adhesive layer 12, the adhesive may be provided in a discontinuous form, such as a dotted form, a stripe form, e.g., with straight and/or curved stripes, or the like.

The liquid adhesive may be dispensed only onto the peripheral portion of the protective film 4 but not onto the wafer W. Alternatively, the liquid adhesive may be dispensed only onto the peripheral portion of the wafer W but not onto the protective film 4. Further, the liquid adhesive may be dispensed onto the peripheral portion of the protective film 4 and onto the peripheral portion of the wafer W.

The liquid adhesive is dispensed so as to form the adhesive layer 12 which is in direct contact with a peripheral portion of the front surface of the protective film 4 and with a peripheral portion of the front side 1 of the wafer W.

The protective film 4 has a diameter which is substantially the same as the diameter of the wafer W (see FIG. 24).

After dispensing the liquid adhesive in the manner detailed above, the protective film 4 is applied to the front side 1 of the wafer W. The protective film 4 is attached to the front side 1 of the wafer W through the adhesive layer 12.

After attaching the protective film 4 to the wafer front side 1, the back side 6 of the wafer W is ground substantially in the same manner as detailed above for the fourth embodiment.

The further processing of the wafer W, i.e., the cutting thereof and the picking up of the separated chips or dies, may be performed substantially in the same manner as detailed above for the first embodiment.

In the following, a method of processing a wafer W according to a tenth embodiment of the present invention will be described with reference to FIG. 25.

The method according to the tenth embodiment differs from the method according to the ninth embodiment in the diameter of the protective film 4 and the arrangement of the adhesive layer 12. In the description of the tenth embodiment, the elements which are substantially identical to those of the previous embodiments are denoted by the same reference signs and a repeated detailed description thereof is omitted.

Figure 25:
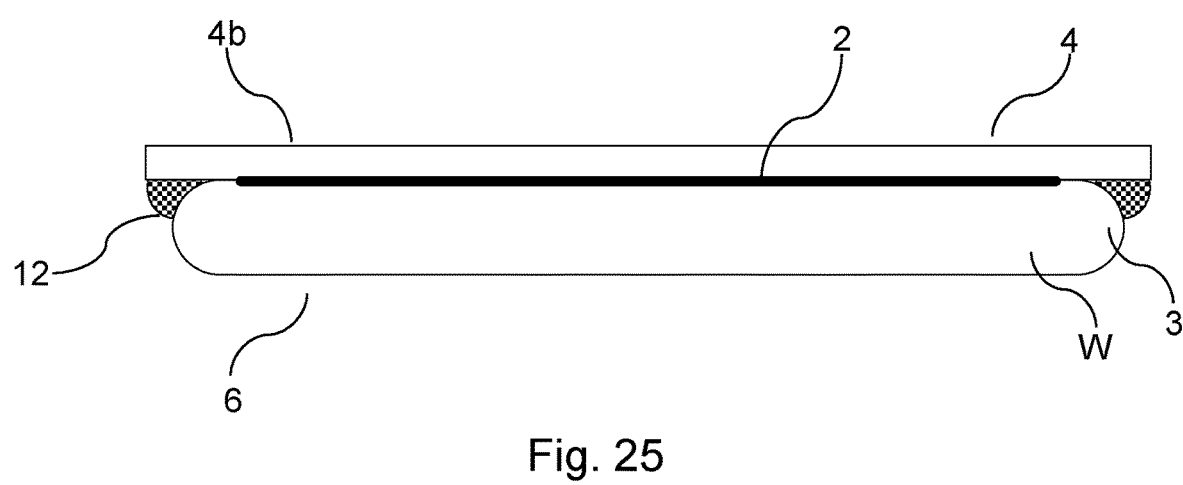
FIG. 25 is a cross-sectional view showing the outcome of steps of dispensing an adhesive and applying a protective film to the wafer according to a tenth embodiment of the method of the present invention.

While protrusions or projections projecting from the plane surface of the wafer W, such as the protrusions 14 detailed above, are omitted in FIG. 25, such protrusions or projections may be present in the device area 7 of the wafer W.

As is illustrated in FIG. 25, the protective film 4 has a diameter which is larger than the diameter of the wafer W. The liquid adhesive is dispensed so as to form the adhesive layer 12 which is in direct contact with a peripheral portion of the front surface of the protective film 4 and with a peripheral portion of the front side 1 of the wafer W and a portion of a peripheral side edge of the wafer W. The adhesive layer 12 has an annular shape. The adhesive layer 12 is arranged so that no adhesive is present in the device area 2 of the wafer W.

The protective film 4 is attached to the front side 1 of the wafer W through the adhesive layer 12.

After attaching the protective film 4 to the wafer front side 1, the back side 6 of the wafer W is ground substantially in the same manner as detailed above for the fourth embodiment.

The further processing of the wafer W, i.e., the cutting thereof and the picking up of the separated chips or dies, may be performed substantially in the same manner as detailed above for the first embodiment.

In the following, a method of processing a wafer W according to an eleventh embodiment of the present invention will be described with reference to FIG. 26.

The method according to the eleventh embodiment differs from the method according to the tenth embodiment in the arrangement of the protective film 4 and the adhesive layer 12. In the description of the eleventh embodiment, the elements which are substantially identical to those of the previous embodiments are denoted by the same reference signs and a repeated detailed description thereof is omitted.

Figure 26:
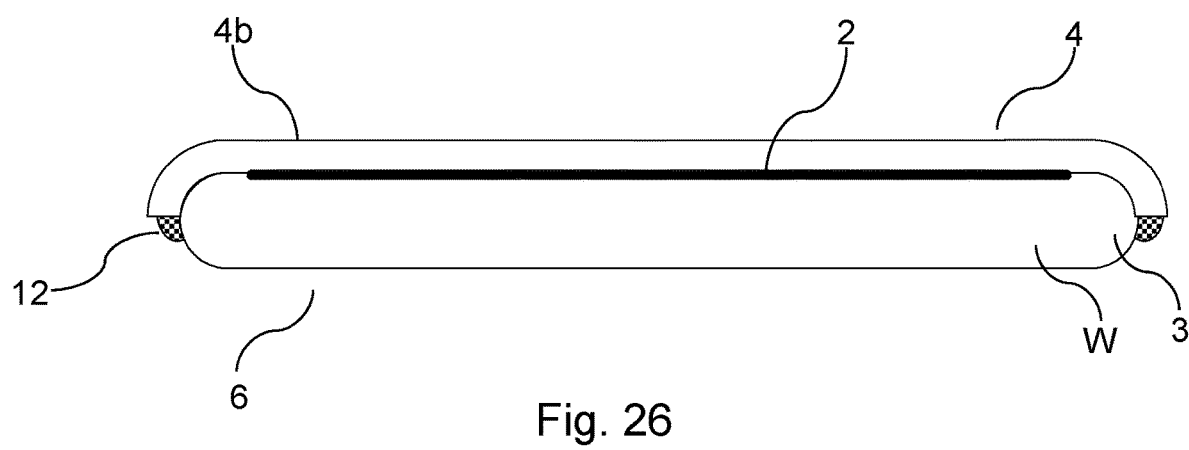
FIG. 26 is a cross-sectional view showing the outcome of steps of dispensing an adhesive and applying a protective film to the wafer according to an eleventh embodiment of the method of the present invention.

While protrusions or projections projecting from the plane surface of the wafer W, such as the protrusions 14 detailed above, are omitted in FIG. 26, such protrusions or projections may be present in the device area 7 of the wafer W.

The protective film 4 has a diameter which is larger than the diameter of the wafer W. Further, a peripheral portion of the protective film 4 is bent downwards, so that a peripheral portion of the front surface of the protective film 4 is in direct contact with a portion of the peripheral side edge of the wafer W, as is illustrated in FIG. 26.

The liquid adhesive is dispensed so as to form the adhesive layer 12 which is in direct contact with a peripheral side edge of the protective film 4 and with a portion of a peripheral side edge of the wafer W. The adhesive layer 12 has an annular shape. The adhesive layer 12 is arranged so that no adhesive is present in the device area 2 of the wafer W.

The liquid adhesive may be dispensed onto the protective film 4 and/or onto the wafer W before applying the protective film 4 to the wafer W. Alternatively, the liquid adhesive may be dispensed onto the protective film 4 and/or onto the wafer W after applying the protective film 4 to the wafer W.

The protective film 4 is attached to the front side 1 of the wafer W through the adhesive layer 12. In addition thereto, the protective film 4 may be attached to the wafer front side 1 by heating the protective film 4 during and/or after applying the protective film 4 to the wafer front side 1. In particular, the protective film 4 may be attached to the wafer W by using the approach detailed above for the first embodiment.

For example, the protective film 4 may be attached to the wafer W first by heating the protective film 4 in the manner detailed above. Subsequently, after the protective film 4 has been attached to the wafer W, the liquid adhesive may be dispensed. The liquid adhesive may be dispensed so as to seal or cover any gaps which may be present between protective film 4 and wafer W at the peripheral portions thereof (see FIG. 26).

After attaching the protective film 4 to the wafer front side 1, the back side 6 of the wafer W is ground substantially in the same manner as detailed above for the fourth embodiment.

The further processing of the wafer W, i.e., the cutting thereof and the picking up of the separated chips or dies, may be performed substantially in the same manner as detailed above for the first embodiment.

In the following, a method of processing a wafer W according to a twelfth embodiment of the present invention will be described with reference to FIG. 27.

The method according to the twelfth embodiment differs from the method according to the ninth embodiment in the arrangement of the adhesive layer 12. In the description of the twelfth embodiment, the elements which are substantially identical to those of the previous embodiments are denoted by the same reference signs and a repeated detailed description thereof is omitted.

Figure 27:
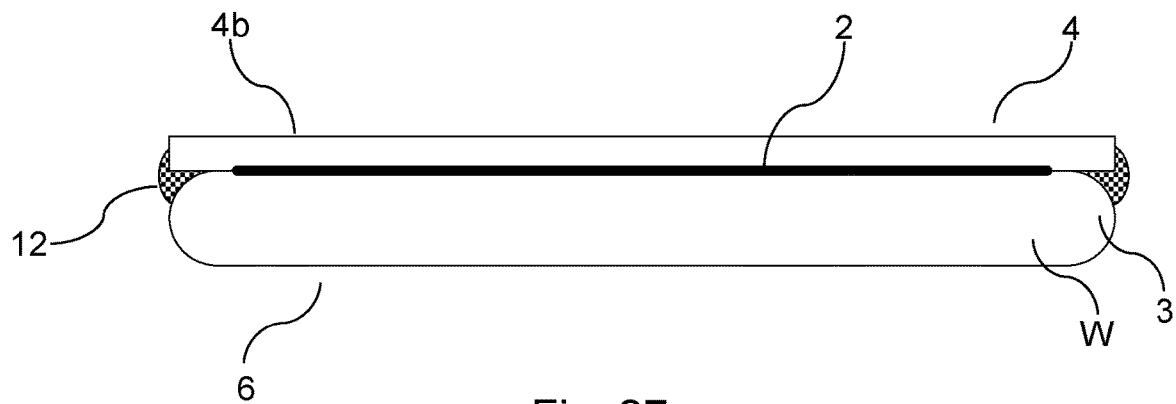
FIG. 27 is a cross-sectional view showing the outcome of steps of dispensing an adhesive and applying a protective film to the wafer according to a twelfth embodiment of the method of the present invention.

While protrusions or projections projecting from the plane surface of the wafer W, such as the protrusions 14 detailed above, are omitted in FIG. 27, such protrusions or projections may be present in the device area 7 of the wafer W.

The protective film 4 has a diameter which is substantially the same as that of the wafer W (see FIG. 27).

The liquid adhesive is dispensed so as to form the adhesive layer 12 which is in direct contact with a portion of the peripheral side edge and a portion of the front surface of the protective film 4 and with a portion of the peripheral side edge and a portion of the front side 1 of the wafer W. The adhesive layer 12 has an annular shape. The adhesive layer 12 is arranged so that no adhesive is present in the device area 2 of the wafer W.

The liquid adhesive may be dispensed onto the protective film 4 and/or onto the wafer W before applying the protective film 4 to the wafer W. Alternatively, the liquid adhesive may be dispensed onto the protective film 4 and onto the wafer W after applying the protective film 4 to the wafer W.

The protective film 4 is attached to the front side 1 of the wafer W through the adhesive layer 12. In addition thereto, the protective film 4 may be attached to the wafer front side 1 by heating the protective film 4 during and/or after applying the protective film 4 to the wafer front side 1. In particular, the protective film 4 may be attached to the wafer W by using the approach detailed above for the first embodiment.

For example, the protective film 4 may be attached to the wafer W first by heating the protective film 4 in the manner detailed above. Subsequently, after the protective film 4 has been attached to the wafer W, the liquid adhesive may be dispensed. The liquid adhesive may be dispensed so as to seal or cover any gaps which may be present between protective film 4 and wafer W at the peripheral portions thereof (see FIG. 27).

After attaching the protective film 4 to the wafer front side 1, the back side 6 of the wafer W is ground substantially in the same manner as detailed above for the fourth embodiment.

The further processing of the wafer W, i.e., the cutting thereof and the picking up of the separated chips or dies, may be performed substantially in the same manner as detailed above for the first embodiment.

In the following, a method of processing a wafer W according to a thirteenth embodiment of the present invention will be described with reference to FIG. 28.

The method according to the thirteenth embodiment differs from the method according to the ninth embodiment in the diameter of the protective film 4 and the arrangement of the adhesive layer 12. In the description of the thirteenth embodiment, the elements which are substantially identical to those of the previous embodiments are denoted by the same reference signs and a repeated detailed description thereof is omitted.

Figure 28:
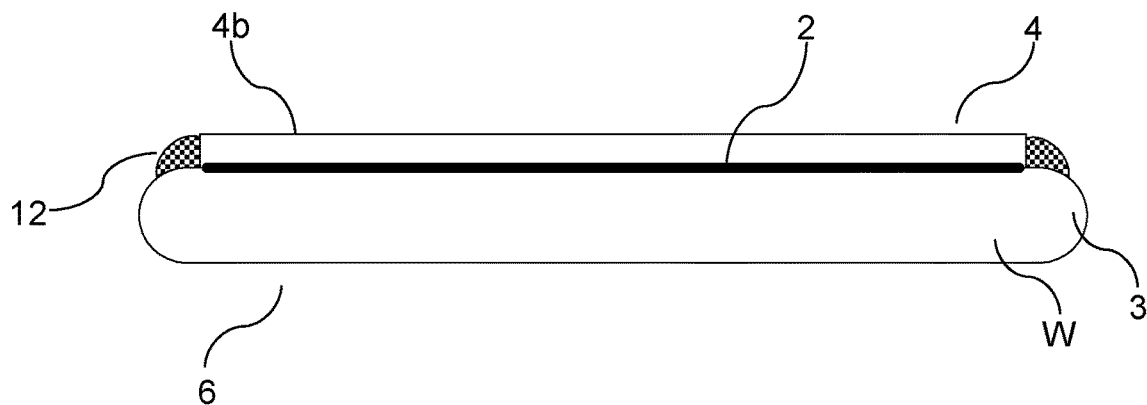
FIG. 28 is a cross-sectional view showing the outcome of steps of dispensing an adhesive and applying a protective film to the wafer according to a thirteenth embodiment of the method of the present invention.

While protrusions or projections projecting from the plane surface of the wafer W, such as the protrusions 14 detailed above, are omitted in FIG. 28, such protrusions or projections may be present in the device area 7 of the wafer W.

The protective film 4 has a diameter which is smaller than the diameter of the wafer W. The diameter of the protective film 4 is substantially equal to that of the device area 2 of the wafer W (see FIG. 28).

The liquid adhesive is dispensed so as to form the adhesive layer 12 which is in direct contact with the peripheral side edge of the protective film 4 and with a portion of the front side 1 of the wafer W. The adhesive layer 12 has an annular shape. The adhesive layer 12 is arranged so that no adhesive is present in the device area 2 of the wafer W.

The liquid adhesive may be dispensed onto the protective film 4 and/or onto the wafer W before applying the protective film 4 to the wafer W. Alternatively, the liquid adhesive may be dispensed onto the protective film 4 and onto the wafer W after applying the protective film 4 to the wafer W.

The protective film 4 is attached to the front side 1 of the wafer W through the adhesive layer 12. In addition thereto, the protective film 4 may be attached to the wafer front side 1 by heating the protective film 4 during and/or after applying the protective film 4 to the wafer front side 1. In particular, the protective film 4 may be attached to the wafer W by using the approach detailed above for the first embodiment.

For example, the protective film 4 may be attached to the wafer W first by heating the protective film 4 in the manner detailed above. Subsequently, after the protective film 4 has been attached to the wafer W, the liquid adhesive may be dispensed. The liquid adhesive may be dispensed so as to seal or cover any gaps which may be present between protective film 4 and wafer W at the peripheral portions thereof (see FIG. 28).

After attaching the protective film 4 to the wafer front side 1, the back side 6 of the wafer W is ground substantially in the same manner as detailed above for the fourth embodiment.

The further processing of the wafer W, i.e., the cutting thereof and the picking up of the separated chips or dies, may be performed substantially in the same manner as detailed above for the first embodiment.

In the following, a method of processing a wafer W according to a fourteenth embodiment of the present invention will be described with reference to FIG. 29.

The method according to the fourteenth embodiment differs from the method according to the ninth embodiment in the diameter of the protective film 4 and the arrangement of the adhesive layer 12. In the description of the fourteenth embodiment, the elements which are substantially identical to those of the previous embodiments are denoted by the same reference signs and a repeated detailed description thereof is omitted.

Figure 29:
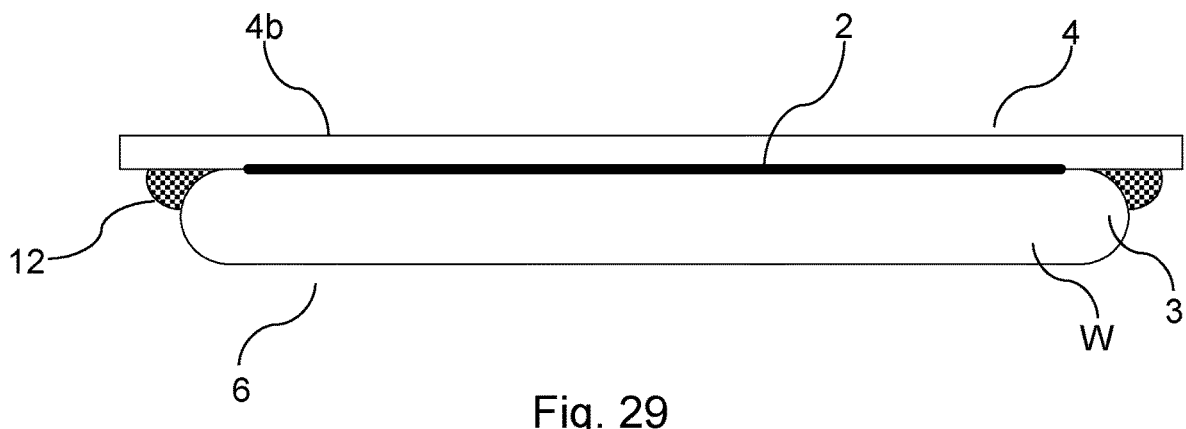
FIG. 29 is a cross-sectional view showing the outcome of steps of dispensing an adhesive and applying a protective film to the wafer according to a fourteenth embodiment of the method of the present invention.

While protrusions or projections projecting from the plane surface of the wafer W, such as the protrusions 14 detailed above, are omitted in FIG. 29, such protrusions or projections may be present in the device area 7 of the wafer W.

The protective film 4 has a diameter which is larger than the diameter of the wafer W (see FIG. 29).

The liquid adhesive is dispensed so as to form the adhesive layer 12 which is in direct contact with a peripheral portion of the front surface of the protective film 4 and with a portion of the peripheral side edge and a portion of the front side 1 of the wafer W.

The adhesive layer 12 has an annular shape. The adhesive layer 12 is arranged so that no adhesive is present in the device area 2 of the wafer W.

The arrangement of the adhesive layer 12 according to the fourteenth embodiment further differs from that according to the ninth embodiment in that an annular portion of the front side 1 of the wafer W, arranged between the substantially circular device area 2 and the inner circumference of the annular adhesive layer 12, is devoid of any adhesive (see FIG. 29). In contrast thereto, in the arrangement of the ninth embodiment, the adhesive layer 12 is provided so that the inner circumference thereof is disposed directly adjacent the device area 2 (see FIG. 24).

The liquid adhesive may be dispensed onto the protective film 4 and/or onto the wafer W before applying the protective film 4 to the wafer W. Alternatively, the liquid adhesive may be dispensed onto the protective film 4 and onto the wafer W after applying the protective film 4 to the wafer W.

The protective film 4 is attached to the front side 1 of the wafer W through the adhesive layer 12. In addition thereto, the protective film 4 may be attached to the wafer front side 1 by heating the protective film 4 during and/or after applying the protective film 4 to the wafer front side 1. In particular, the protective film 4 may be attached to the wafer W by using the approach detailed above for the first embodiment.

For example, the protective film 4 may be attached to the wafer W first by heating the protective film 4 in the manner detailed above. Subsequently, after the protective film 4 has been attached to the wafer W, the liquid adhesive may be dispensed. The liquid adhesive may be dispensed so as to seal or cover any gaps which may be present between protective film 4 and wafer W at the peripheral portions thereof (see FIG. 29).

After attaching the protective film 4 to the wafer front side 1, the back side 6 of the wafer W is ground substantially in the same manner as detailed above for the fourth embodiment.

The further processing of the wafer W, i.e., the cutting thereof and the picking up of the separated chips or dies, may be performed substantially in the same manner as detailed above for the first embodiment.

The protective film 4 of the ninth to fourteenth embodiments may be used in combination with the cushioning layer 8 or in combination with the cushioning layer 8 and the base sheet 9 of the previous embodiments, substantially in the same manner as detailed above.

The invention claimed is:

1. A method of processing a wafer, having on one side a device area with a plurality of devices, wherein the method comprises:
   providing a protective film;
   providing a liquid adhesive;
   dispensing the liquid adhesive onto the protective film and/or onto the wafer;
   applying the protective film, for covering the devices on the wafer, to the one side of the wafer, before dispensing the liquid adhesive, the protective film being attached to the one side of the wafer by heating the protective film during and/or after applying the protective film to the one side of the wafer; and
   processing a side of the wafer opposite to the one side,
   wherein the liquid adhesive is dispensed onto a peripheral portion of the protective film without being dispensed onto a central portion of the protective film, and/or onto a peripheral portion of the wafer without being dispensed onto a central portion of the wafer.

2. The method according to claim 1, wherein the liquid adhesive is dispensed onto the protective film and/or onto the wafer before applying the protective film to the one side of the wafer and/or after applying the protective film to the one side of the wafer.

3. The method according to claim 1, wherein the liquid adhesive is dispensed onto the protective film and/or onto the wafer so that, after applying the protective film to the one side of the wafer, no adhesive is present in the device area of the wafer.

4. The method according to claim 1, wherein a cushioning layer is attached to a back surface of the protective film.

5. The method according to claim 1, wherein the protective film is made of a polymer, in particular, a polyolefin.

6. The method according to claim 4, wherein a base sheet is attached to a back surface of the cushioning layer.

* * * * *